United States Patent
Kim et al.

(10) Patent No.: US 8,821,827 B2
(45) Date of Patent: *Sep. 2, 2014

(54) METHOD AND APPARATUS FOR PREPARATION OF GRANULAR POLYSILICON

(75) Inventors: Hee Young Kim, Daejeon (KR); Kyung Koo Yoon, Daejeon (KR); Yong Ki Park, Daejeon (KR); Won Choon Choi, Daejeon (KR)

(73) Assignee: Korea Research Institute of Chemical Technology, Daejeon (KR)

( * ) Notice: Subject to any disclaimer, the term of this patent is extended or adjusted under 35 U.S.C. 154(b) by 418 days.

This patent is subject to a terminal disclaimer.

(21) Appl. No.: 12/609,414

(22) Filed: Oct. 30, 2009

(65) Prior Publication Data

US 2010/0068116 A1 Mar. 18, 2010

Related U.S. Application Data

(63) Continuation of application No. 12/282,604, filed as application No. PCT/KR2007/003827 on Aug. 9, 2007.

(30) Foreign Application Priority Data

Aug. 10, 2006 (KR) .................. 10-2006-0075897

(51) Int. Cl.
*C01B 33/021* (2006.01)
*B01J 8/24* (2006.01)

(52) U.S. Cl.
USPC ............ 423/349; 422/139; 422/142; 422/145

(58) Field of Classification Search
USPC ................... 422/139, 145, 146, 284; 423/349
See application file for complete search history.

(56) References Cited

U.S. PATENT DOCUMENTS

| 4,416,914 A | 11/1983 | Eichelberger et al. | |
| 4,532,108 A * | 7/1985 | Becht, IV | 422/143 |

(Continued)

FOREIGN PATENT DOCUMENTS

| JP | 57145021 A * | 9/1982 | ............. C01B 33/02 |
| JP | 59-045917 | 3/1984 | |
| JP | 2001-146412 | 5/2001 | |
| JP | 2002-113350 | 4/2002 | |

OTHER PUBLICATIONS

English translation of JP01-168333.*

(Continued)

*Primary Examiner* — Jun Li
(74) *Attorney, Agent, or Firm* — Frommer Lawrence & Haug LLP; Ronald R. Santucci

(57) ABSTRACT

An apparatus for preparing granular polysilicon comprises a reactor tube, a reactor shell, an internal heater, and components for controlling pressure, supplying a fluidizing gas and a reaction gas, discharging gas, and discharging particles. The reactor tube is associated with an inner space comprising an inner zone that contains a bed of silicon particles and is the site at which silicon deposition occurs. The inner zone comprises a heating zone and a reaction zone. The fluidizing gas supplying component supplies a fluidizing gas for fluidizing the bed of silicon particles to a bottom of the heating zone. The apparatus can minimize the problems occurring during the heating of silicon particles at high temperature for silicon deposition on the surface of the silicon particles.

38 Claims, 7 Drawing Sheets

(56) References Cited

U.S. PATENT DOCUMENTS

| | | | |
|---|---|---|---|
| 4,755,138 | A | 7/1988 | Owen et al. |
| 4,992,245 | A | 2/1991 | Van Slooten et al. |
| 5,165,908 | A | 11/1992 | Van Slooten et al. |
| 5,374,413 | A | 12/1994 | Kim et al. |
| 5,382,412 | A | 1/1995 | Kim et al. |
| 5,946,341 | A | 8/1999 | Bizzarri |
| 6,007,869 | A | 12/1999 | Schreieder et al. |
| 6,541,377 | B2 | 4/2003 | Kim et al. |
| 6,827,786 | B2 | 12/2004 | Lord |
| 6,829,955 | B1 * | 12/2004 | Mahgerefteh ............... 73/865.5 |
| 7,029,632 | B1 | 4/2006 | Weidhaus et al. |
| 2007/0108189 | A1 | 5/2007 | Cheng et al. |
| 2007/0178028 | A1 | 8/2007 | Fukasawa et al. |

OTHER PUBLICATIONS

J.F. Richardson, J.H. Harker and J.R. Backhurst, Coulson and Richardson's Chemical Engineering Particle Technology and Separation Processes, 2002, p. 334, vol. 2, $5^{th}$ Ed., Butterworth-Heinemann.

Wen-Ching Yang, Gas Distributor and Plenum Design in Fluidized Beds, Fluidization, Solids Handling and Processing—Industrial Applications, 1998, pp. 209-212 and p. 223, Noyes Publications, Westwood, New Jersey.

Simeon N. Oka and E.J. Anthony, Fluidized Bed Combustion, 2004, pp. 18-20, pp. 97-98 and pp. 439-446, Marcel Dekker, Inc., New York.

* cited by examiner (a)

(b)

(c)

(d)

METHOD AND APPARATUS FOR PREPARATION OF GRANULAR POLYSILICON

CROSS-REFERENCE TO RELATED APPLICATIONS

This application is a continuation of U.S. patent application Ser. No. 12/282,604 filed Sep. 11, 2008 entitled "Method and Apparatus for Preparation of Granular Polysilicon" which is a 371 application of PCT/KR2007/003827 filed Aug. 9, 2007 and which claims priority benefits of Korean Application Number 10-2006-0075897 filed Aug. 10, 2006, the disclosures of all applications of which are incorporated herein by reference.

TECHNICAL FIELD

The present invention relates to a method and an apparatus for the preparation of granular polysilicon (polycrystalline silicon, multicrystalline silicon, or poly-Si) using a fluidized bed reactor, more particularly to a method and an apparatus for the preparation of granular polysilicon which enable stable operation of the reactor for a long period of time by minimizing the problems occurring during the heating of silicon particles at high temperature for silicon deposition on the surface of the silicon particles.

BACKGROUND ART

In general, high-purity polysilicon is widely used as a chemical or industrial source material in semiconductor devices, solar cells, etc., requiring semiconductor properties or high purity. Also, it is used in functional precision devices and small-sized, highly-integrated precision systems.

High-purity polysilicon is prepared by repeated silicon deposition on the surface of silicon particles based on thermal decomposition and/or hydrogen reduction of a highly purified silicon-containing reaction gas.

In commercial-scale production of polysilicon, a bell-jar type reactor has been mainly used thus far. Polysilicon products produced using the bell-jar type reactor are rod-shaped and have a diameter of about 50-300 mm. Preparing polysilicon using a bell-jar type reactor based on electrical resistance heating cannot be executed in a continuous manner because there is a limit in increaseing the rod diameter according to silicon deposition. In addition, the deposition efficiency is poor because the surface area required for silicon deposition is restricted and also excessive thermal loss results in high power consumption per unit volume of the product.

To solve these problems, a silicon deposition process using a fluidized bed reactor to produce polysilicon in the form of granules, i.e., particles having a size of about 0.5-3 mm, has been developed recently. According to this method, a gas supplied from the bottom to the top of the reactor forms a fluidized bed in which silicon particles are fluidized. The silicon particles become enlarged as silicon elements deposit out of the silicon-containing reaction gas which is introduced into the hot fluidized bed.

As in the bell-jar type reactor, such Si—H—Cl-based silane compound as monosilane ($SiH_4$), dichlorosilane ($SiH_2Cl_2$), trichlorosilane ($SiHCl_3$), tetrachlorosilane ($SiCl_4$), and a mixture thereof is used in the fluidized bed reactor as the silicon-containing reaction gas. Usually, the reaction gas further comprises at least one gas component selected from hydrogen, nitrogen, argon, helium, etc.

To achieve silicon deposition for production of polysilicon, the reaction temperature, or the temperature of the silicon particles, should be maintained at about 600-850° C. for monosilane, and at about 900-1,100° C. for trichlorosilane, which is the most widely used in commercial-scale production.

During the silicon deposition process, a variety of elementary reactions occur in the process of thermal decomposition and/or hydrogen reduction of the silicon-containing reaction gas. Further, the silicon elements grow into particles in different ways, depending on a composition of the reaction gas. Irrespective of the elementary reactions comprised therein and the ways of particle growth, the fluidized bed reactor yields a granular polysilicon product.

As silicon deposition and/or binding of the fine silicon particles continue, small silicon seed crystals grow in size and gradually sink toward the bottom of the fluidized bed. The seed crystals may be directly generated inside the fluidized bed reactor or may be supplied continuously, periodically or intermittently into the fluidized bed reactor after being prepared outside the fluidized bed. The polysilicon product, or the silicon particles, which are enlarged due to silicon deposition, may be withdrawn continuously, periodically or intermittently from the bottom of the reactor.

The fluidized bed reactor is advantageous over the bell-jar type reactor in production yield, because of the large surface area at which silicon deposition can occur. Further, the granular polysilicon product may be readily handled in the silicon application processes, including single crystal growth, preparation of crystal block or film, surface treatment and modification, preparation of chemical materials for reaction or separation, shaping or pulverizing of silicon particles, etc., differently from the rod-shaped product. Besides, the granular polysilicon products allow such processes to be operated in a continuous or semi-continuous manner.

One of the most difficult steps in the continuous or semi-continuous production of granular polysilicon using the fluidized bed reactor is to heat the silicon particles in order to maintain the temperature required for the deposition. The following problems are involved in heating the silicon particles in order to maintain the temperature required for the deposition reaction, while minimizing impurity contamination of the silicon particles within the fluidized bed reactor. The reaction gas supplied to the fluidized bed reactor can lead to the silicon deposition at a temperature of about 300° C. or higher. But, since silicon deposition occurs on the wall of the reaction-gas heating means and the silicon deposit becomes accumulated as operation proceeds, the reaction gas cannot be sufficiently preheated before being supplied into the fluidized bed reactor. Further, since silicon deposition also occurs on the surface of the components of the reactor, which are constantly exposed to the hot reaction gas, the silicon deposit is naturally accumulated thereon. It is therefore difficult to sufficiently heat the silicon particles by the conventional method of heating the walls of the reactor, and also it is impossible to operate the reactor stably for a long period of time. In addition, few methods are available that enable the effective heating of the silicon particles while minimizing impurity contamination.

A variety of technical solutions have been proposed to solve these problems. Mostly, they are based on partitioning the inner space of the fluidized bed reactor into a reaction zone where the deposition occurs on the surface of the silicon particles and a heating zone for heating the silicon particles and indirectly heating the reaction zone through the heating zone.

In one of the methods of partitioning the inner space of the fluidized bed reactor into a heating zone and a reaction zone, a tube-shaped partitioning means is installed inside the layer of silicon particles, so that the outside space surrounding the partitioning means is heated by an external heater and the space inside the partitioning means becomes the reaction zone where the silicon deposition occurs. According to this method, as described in Japanese Patent No. 1984-045917 and U.S. Pat. No. 4,416,914 (1983), U.S. Pat. No. 4,992,245 (1991) and U.S. Pat. No. 5,165,908 (1992), etc., a continuously circulating fluidized bed is formed as the silicon particles move downward in the heating zone and they move upward in the reaction zone carried by the reaction gas. But, this method has the following problems. Because the partitioning means, which partition the reaction zone and the heating zone concentrically, has a diameter smaller than the outer diameter of the heating zone, silicon deposition and accumulation occur severely on the inner surface of the partitioning means which is exposed to the reaction zone, making it difficult to operate the reactor for a long period of time. Also, since the circulation of the silicon particles along the circumferential direction is non-uniform, the method is not suitable for a large-scale production.

As another method of partitioning the inner space of the fluidized bed reactor into a heating zone and a reaction zone, it is possible to locate the reaction gas outlet of the reaction gas supplying means in the bed of silicon particles so that the upper and lower spaces can be defined as the reaction zone and the heating zone, respectively, with the height of the reaction gas outlet being the reference for the partition. The silicon particles in the heating zone are heated to maintain the reaction temperature of the reaction zone. According to this method, a fluidizing gas which does not cause silicon deposition, such as hydrogen, is supplied from the bottom to the top of the reactor, so that all or a part of the silicon particles in the heating zone are fluidized. Further, the silicon particles in the reaction zone are fluidized by a reaction gas. As the silicon particles are intermixed at the interface of the two zones, heat is continuously transferred from the heating zone to the reaction zone. In relation to this, U.S. Pat. No. 5,374,413 (1994), U.S. Pat. No. 5,382,412 (1995), U.S. Pat. No. 6,007,869 (1999), U.S. Pat. No. 6,541,377 (2003) and U.S. Pat. No. 7,029,632 (2006) and Japanese Patent No. 2001-146412 disclose a method of dividing the space of bed of silicon particles into a reaction zone and a heating zone and heating the heating zone by the conventional method using an electrical resistance heater, microwave heating means, etc. to maintain the reaction temperature inside the reaction zone. However, considering the productivity problem of the fluidized bed reactor, or the fact that it is difficult to maintain the bed of silicon particles at a predetermined reaction temperature for large-sized reactors, a method capable of heating the heating zone more efficiently is required for the large-scale production of polysilicon using a fluidized bed reactor. Further, because much energy is used to heat the fast flowing fluidizing gas in the heating zone requires, the heating of silicon particles becomes inefficient.

In relation to this, U.S. Pat. No. 6,827,786 (2004) proposes a fluidized bed reaction system in which the upper and lower spaces in the bed of silicon particles are divided into a reaction zone and a heating zone and a tube heated by a heater supplies a small amount of a fluidizing gas to the heating zone, so that the fluidizing gas can be heated to the reaction temperature or above, without causing fluidization of the silicon particles in the heating zone. A pulsing device pulses the silicon particles back and forth, so that they can be periodically intermixed at the interface of the heating zone and the reaction zone, thereby maintaining the deposition reaction temperature. The application of pulsed physical impact to the bed of silicon particles using the pulsing device as proposed in U.S. Pat. No. 6,827,786 leads to forced intermixing of some of the silicon particles in the heating zone and the reaction zone. But, with this method, it is difficult to uniformly mix the particles while minimizing the temperature difference of the two zones in a large-sized reactor. Unlike other components commonly used in chemical processes, there is restriction in material selection of the components of the fluidized bed reactor. Particularly, the reactor tube in contact with which contacts the silicon particles should not be the source of impurity contamination in preparation of high-purity polysilicon. The reactor tube, the essential component of the fluidized bed reactor for polysilicon production, is in constant contact with hot fluidized silicon particles and is thus generally made of high-purity quartz or silicon to prevent impurity contamination. Because of irregular vibration and severe stress caused by the movement of silicon particles, the reactor tube is vulnerable to mechanical impact. Thus, the periodical application of physical impact to the bed of silicon particles using the pulsing device as disclosed in U.S. Pat. No. 6,827,786 may significantly impair the stability of the reactor tube and make the safe, sustained operation of the fluidized bed reactor difficult.

Accordingly, construction of the heating zone capable of solving the aforementioned problems and stably maintaining the reaction temperature in the reaction zone without affecting the mechanical stability of the fluidized bed reactor and an operation method thereof are prerequisites for large-scale production of granular polysilicon. Besides, supply of sufficient heat is necessary in order to significantly improve the productivity of the fluidized bed reactor by increasing the reaction pressure. It is important to construct and operate the fluidized bed reactor so that the heat supplied from the heating zone can be effectively utilized in the reaction zone, while maximizing the heat load in the heating zone.

Accordingly, an object of the present invention is to provide a method and an apparatus capable of improving the productivity of a fluidized bed reactor by stably maintaining the silicon deposition condition through sufficient supply of heat required for the preparation of granular polysilicon, without sacrificing the mechanical stability of the fluidized bed reactor.

To attain the objective, the present inventors completed the present invention based on the experimental finding that it is preferable that the construction and operation of a fluidized bed reactor for granular polysilicon satisfy the following conditions:

(1) the space that forms the bed of silicon particles within the reactor tube should be divided into a reaction zone and a heating zone by a reaction gas supplying means;

(2) the heat required for silicon deposition in the reaction zone is supplied by heating both the silicon particles in the heating zone and the fluidizing gas continuously passing through the zone using an internal heater installed at the inner space of the heating zone; and (3) the silicon particles need to be intermixed between the reaction zone and the heating zone in a continuous, fluidized state, so that the heat supplied to the heating zone can be rapidly transferred to the reaction zone.

BRIEF DESCRIPTION OF THE DRAWINGS

The above and other features of the present invention will be described with reference to certain exemplary embodiments thereof illustrated the attached drawings, in which.

DESCRIPTION OF THE INVENTION

Figure 1:
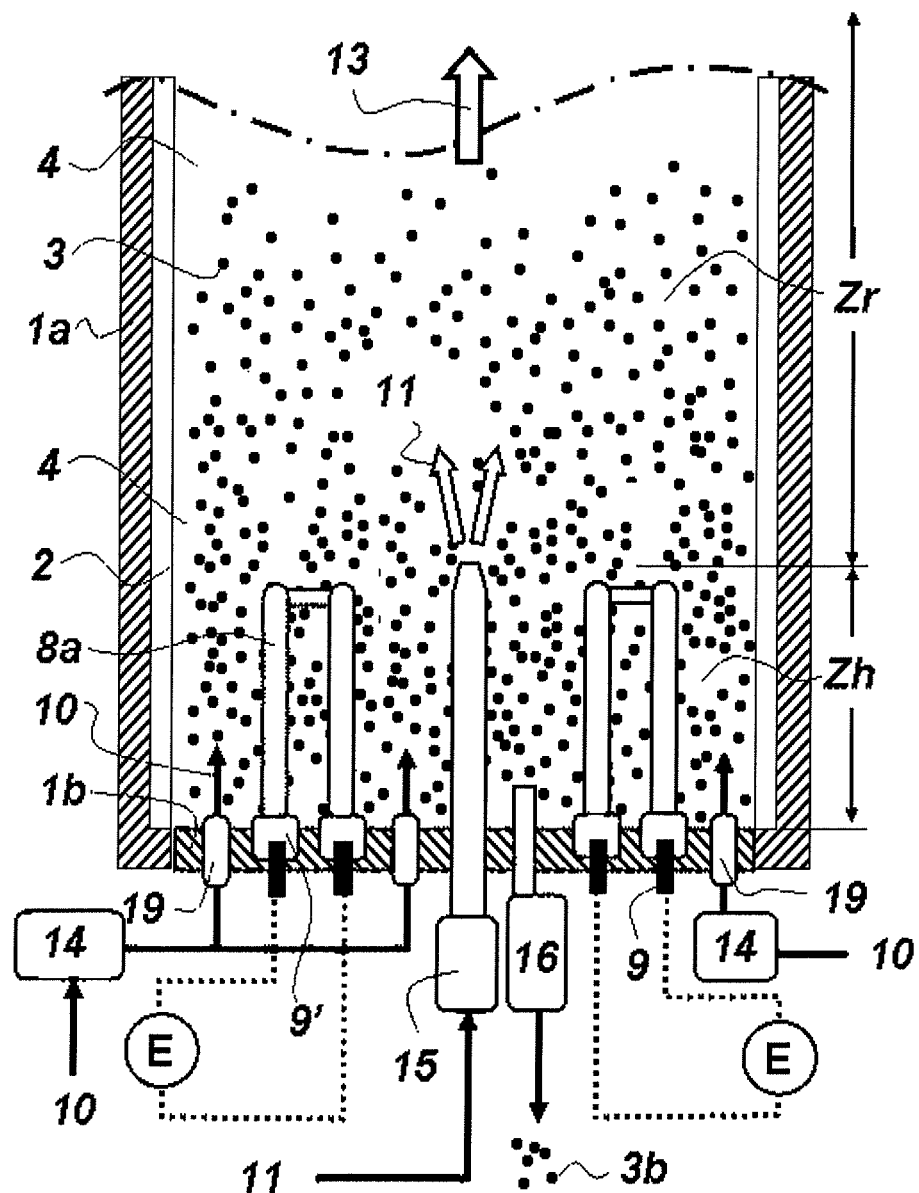
FIG. 1 schematically illustrates a method for preparing granular polysilicon according to the present invention.

In order to attain the aforementioned objective, the present invention provides a method for preparing polysilicon using a fluidized bed reactor, which comprises: forming a bed of silicon particles within a reactor tube, installed vertically within a reactor shell, on a fluidizing gas supplying means that supplies a fluidizing gas into the bed of silicon particles; setting up a reaction gas supplying means vertically within bed of silicon particles, so that a reaction gas outlet of the reaction gas supplying means can be located higher than a fluidizing gas outlet of the fluidizing gas supplying means; defining the upper and lower spaces in the reactor tube as a reaction zone and a heating zone, respectively, with the height of the reaction gas outlet being selected as the reference height; performing electrical resistance heating using an internal heater installed in a space in between the reaction gas supplying means and the inner wall of the reactor tube, thereby heating the fluidizing gas and the silicon particles in the heating zone; supplying the fluidizing gas at such a rate that the silicon particles can be intermixed between the reaction zone and the heating zone in a continuous, fluidized state, thereby maintaining the reaction temperature of the reaction zone within a predetermined reaction temperature range; supplying a reaction gas using the reaction gas supplying means, so that silicon particles can grow in size by silicon deposition in the reaction zone; discharging an off-gas comprising the fluidizing gas passing through the reaction zone, an unreacted reaction gas and a reaction byproduct gas out of the fluidized bed reactor using a gas discharging means; and discharging a part of the silicon particles out of the fluidized bed reactor as silicon product particles using a particle discharging means.

Optionally, a packed bed may be formed in a space, which is comprised in the heating zone and enclosed by the inner wall of the reactor tube, the fluidizing gas supplying means, the reaction gas supplying means and the internal heater, using packing materials that are not fluidized by the flow of the fluidizing gas, so that the fluidizing gas can be heated while passing through the packed bed.

Optionally, the silicon product particles may be discharged out of the fluidized bed reactor by the particle discharging means after residing in or moving through a space formed between the packing materials.

In a preferred embodiment, the reaction temperature is maintained within the range of from 600 to 1,200° C.

In a preferred embodiment, the internal heater comprises one or a plurality of heater units. The respective heater unit comprises a resistive element where electrical resistance heating occurs. In order to prevent or minimize contamination of the silicon particles by the resistive element, the resistive element may be installed inside a protection tube. Instead, one or a plurality of separation layers may be formed on the surface of the resistive element. Alternatively, the heater unit may be constructed by forming a separation layer on the resistive element and surrounding it with a protection tube.

In a preferred embodiment, the fluidizing gas may comprise at least one selected from the group consisting of hydrogen ($H_2$), nitrogen ($N_2$), argon (Ar), helium (He), tetrachlorosilane ($SiCl_4$), trichlorosilane ($SiHCl_3$), dichlorosilane ($SiH_2Cl_2$), hydrogen chloride (HCl), and a mixture thereof.

In a preferred embodiment, the reaction gas may comprise at least one silicon-containing component selected from the group consisting of monosilane ($SiH_4$), dichlorosilane, trichlorosilane, tetrachlorosilane, and a mixture thereof.

Optionally, the reaction gas may further comprise at least one selected from the group consisting of hydrogen, nitrogen, argon, helium, hydrogen chloride, and a mixture thereof.

Optionally, silicon seed crystals prepared outside the fluidized bed reactor may be supplied into the reactor tube using a seed crystal supplying means.

In a preferred embodiment, the feeding rate of the fluidizing gas supplied into the heating zone per unit time is 1.0-5.0 times the feeding rate at a minimal fluidized state where the silicon particles starts to be fluidized in the reaction temperature range in the reaction zone without supplying the reaction gas.

Optionally, the reaction gas supplying means exposed to heating zone is constructed in the form of a coaxial multitube in which one or a plurality of nozzles surround a reaction gas nozzle for supplying the reaction gas, so that the reaction gas nozzle can be protected.

Optionally, an inert gas comprising at least one selected from the group consisting of hydrogen, nitrogen, argon, helium, and a mixture thereof flows at an annular region of the coaxial multitube, so that the accumulation of silicon deposit in the inner wall of the reaction gas nozzle can be prevented Optionally, hydrogen chloride may be added to the inert gas continuously, intermittently or periodically in order to prevent the accumulation of silicon deposit at the outlet of the reaction gas nozzle or to remove the silicon deposit that has been formed.

In a preferred embodiment, the fluidized bed reactor is constructed such that a reactor tube is installed vertically within a reactor shell so as to be enclosed by the reactor shell, whereby dividing an inner space of the reactor shell into an inner zone formed within the reactor tube and an outer zone formed in between the reactor shell and the reactor tube, wherein the bed of silicon particles is present and the reaction zone and the heating zone are comprised in the inner zone while the bed of silicon particles is not present and silicon deposition does not occur in the outer zone.

Optionally, an inert gas selected from the group consisting of hydrogen, nitrogen, argon, helium, and a mixture thereof is introduced into the outer zone, so that the outer zone is maintained under a substantially inert gas atmosphere.

In a preferred embodiment, the difference of the outer zone pressure (Po) and the inner zone pressure (Pi) is maintained within the range of $0 \text{ bar} \leq |Po-Pi| \leq 1 \text{ bar}$.

Optionally, the outer zone pressure ($P_o$) or the inner zone pressure ($P_i$) is maintained within the range of 1-20 bar (absolute).

Optionally, in addition to the internal heater, a supplemental heater is equipped in the outer zone to heat the inner zone.

Optionally, the heat load of the supplemental heater is within 10-100% of the heat load of the internal heater.

Optionally, the inner zone is heated by microwave in addition to the internal heater.

To attain the object of the present invention, the fluidized bed reactor for preparing granular polysilicon comprises: a reactor tube; a reactor shell enclosing the reactor tube; a fluidizing gas supplying means for supplying a fluidizing gas to the bottom of a bed of silicon particles formed within the reactor tube; a reaction gas supplying means installed vertically within the bed of silicon particles for supplying a reaction gas required for silicon deposition into the bed of silicon particles, so that the reaction gas outlet of the reaction gas supplying means is located higher than the fluidizing gas supplying means; an internal heater installed in a space in between the reaction gas supplying means and the inner wall of the reactor tube; a reaction zone and a heating zone, which represent the upper and lower spaces in the reactor tube, respectively, with the height of the reaction gas outlet being selected as the reference height; a space formed in between the reactor tube, the internal heater and the reaction gas supplying means, wherein the fluidizing gas and the silicon particles are heated by electrical resistance heating of the internal heater so that particle intermixing between the reaction zone and the heating zone is maintained in a continuous, fluidized state; a gas discharging means for discharging an off-gas comprising the fluidizing gas passing through the reaction zone, an unreacted reaction gas and a reaction byproduct gas out of the fluidized bed reactor; and a particle discharging means for discharging a part of the silicon particles prepared in the reactor tube by the silicon deposition out of the fluidized bed reactor as silicon product particles.

Optionally, a packed bed of packing materials may be formed in a space, which is comprised in the heating zone and enclosed by the inner wall of the reactor tube, the fluidizing gas supplying means, the reaction gas supplying means and the internal heater, using the packing materials that are not fluidized by the flow of the fluidizing gas.

In a preferred embodiment, the inner space of the reactor tube is defined as an inner zone where the bed of silicon particles is present and silicon deposition occurs, while the space in between the reactor tube and the reactor shell is defined as an outer zone where the bed of silicon particles is not present and silicon deposition does not occur.

In a preferred embodiment, the reactor shell may be made of at least one metal selected from carbon steel and stainless steel.

In a preferred embodiment, the reactor tube may be made of a single component material or a plurality of materials selected from the group consisting of quartz, silica, silicon nitride, boron nitride, silicon carbide, graphite, glassy carbon, silicon, and a mixture thereof.

Optionally, the reactor tube consists of a single layer or a plurality of layers in the thickness direction each layer of which is made of a different material.

In a preferred embodiment, the packing materials have an average diameter of 5-50 mm and have a shape selected from the group consisting of sphere, bead, ball, granule, fragment, lump, spheroid, polyhedron, pebble, pellet, ring, nugget, and a mixture thereof.

In a preferred embodiment, the internal heater comprises one or a plurality of heater units.

Optionally, the heater units are electrically interconnected in series and/or in parallel.

In a preferred embodiment, the heater units are electrically connected to a power supply source through an electrical connection means as coupled with the reactor shell.

In a preferred embodiment, the electrical connection means comprises electrodes installed inside and/or outside of the reactor shell. Through the electrodes, the heater units are electrically interconnected in series and/or in parallel.

Optionally, the electrodes may be made of a metal or an alloy selected from the group consisting of copper (Cu), aluminum (Al), cadmium (Cd), and a mixture thereof, or of graphite the surface of which is treated as silicon carbide.

Optionally, in addition to the internal heater, a supplemental heater may be further installed equipped in the outer zone.

Optionally, in addition to the internal heater, a waveguide, which transmits the microwave generated by a microwave generator from electrical energy, or a microwave generator is further installed as coupled with the reactor shell to supply the microwave into the inner zone for heating the silicon particles therein.

In a preferred embodiment, the fluidizing gas supplying means comprises a gas distribution plate in the form of a grid, a disc or a conical plate or a gas distribution assembly having a plurality of holes for the distribution of the fluidizing gas at the bottom of the heating zone and/or comprises a plurality of fluidizing gas supplying nozzles.

Optionally, the section of the reaction gas supplying means exposed to heating zone is constructed in the form of a coaxial multitube in which a reaction gas nozzle for supplying the reaction gas is enclosed by one or a plurality of nozzles.

Optionally, the particle discharging means is constructed in the form of a coaxial multitube along with the reaction gas supplying means or in an independent form separately from the reaction gas supplying means.

Optionally, the fluidizing gas supplying means, the reaction gas supplying means, the particle discharging means and/or the packing materials are made of a material selected from the group consisting of quartz, silica, silicon nitride, boron nitride, silicon carbide, graphite, silicon, glassy carbon, and a mixture thereof.

Optionally, the fluidizing gas supplying means, the reaction gas supplying means, the particle discharging means and/or the packing materials may consist of a single component material or of a plurality of layers in the thickness direction each layer of which is made of a different material.

Optionally, the apparatus of the present invention comprises an inert gas connecting means for maintaining a substantially inert gas atmosphere in the outer zone, a pressure controlling means for measuring and/or controlling the inner zone pressure (Pi) and/or the outer zone pressure (Po) and/or a pressure-difference controlling means for maintaining the difference in the outer zone pressure ($P_o$) and the inner zone pressure ($P_i$) in the range of 0 bar≤|$P_o$−$P_i$|≤1 bar.

Optionally, an insulating material is installed at the outer zone.

In a preferred embodiment, a resistive element, which is comprised in the heater unit and at which electrical resistance heating occurs, is in the form of a rod, a wire, a filament, a bar, a strip or a ribbon having circular, elliptical or polygonal cross-section, or of a conduit, a tube, a cylinder or a duct having concentric circular, elliptical or polygonal cross-section, with the shape and/or dimension of the cross-section being uniform or variable along the length direction.

Optionally, the resistive element is made of one or two materials selected from graphite, silicon carbide and silicon.

Optionally, the resistive element is made of a metal or an alloy selected from the group consisting of tungsten (W), rhenium (Re), osmium (Os), tantalum (Ta), molybdenum (Mo), niobium (Nb), iridium (Ir), ruthenium (Ru), technetium (Tc), hafnium (Hf), rhodium (Rh), vanadium (V), chromium (Cr), zirconium (Zr), platinum (Pt), thorium (Th), lanthanum (La), titanium (Ti), lutetium (Lu), yttrium (Y), iron (Fe), nickel (Ni), magnesium (Mg), aluminum (Al), and a mixture thereof.

Optionally, the resistive element is made of a ceramic metal selected from the group consisting of molybdenum silicide (Mo—Si), lanthanum chromite (La—Cr—O), zirconia, and a mixture thereof.

In a preferred embodiment, the heater unit is constructed by installing a protection tube outside the resistive element, by forming one or a plurality of separation layers on the surface of the resistive element, or by installing a protection tube outside the resistive element after forming the separation layer(s) thereon in order to prevent direct contact of the resistive element with silicon particles.

Optionally, the protection tube has concentric circular, elliptical or polygonal cross-section in the thickness direction.

Optionally, the separation layer(s) and/or the protection tube may comprise 1 to 5 separation layers, each made of a different barrier component.

In a preferred embodiment, the barrier component comprises a component for preventing impurities from migrating to the silicon particles and/or the fluidizing gas from the resistive element.

In a preferred embodiment, the barrier component comprises an electrically insulating component. Optionally, the barrier component comprises nitride, oxide, carbide or oxynitride of silicon (Si) or boron (B).

Optionally, the barrier component comprises nitride, oxide, silicide, boride, carbide, oxynitride or silicon oxide of one or a plurality of metal elements selected from the group consisting of tungsten (W), rhenium (Re), osmium (Os), tantalum (Ta), molybdenum (Mo), niobium (Nb), iridium (Ir), ruthenium (Ru), technetium (Tc), hafnium (Hf), rhodium (Rh), vanadium (V), chromium (Cr), zirconium (Zr), platinum (Pt), thorium (Th), lanthanum (La), titanium (Ti), lutetium (Lu), yttrium (Y), iron (Fe), nickel (Ni), magnesium (Mg), aluminum (Al), and a mixture thereof.

Optionally, the thickness of the separation layer(s) is in the range of from 1 μm to 5 mm and/or the thickness of the protection tube is in the range of from 1 mm to 20 mm.

Optionally, the separation layer(s) further comprises a silicon layer having a thickness in the range of from 1 μm to 5 mm with silicon being the barrier component.

Now, the present invention is described in further detail referring to the attached drawings.

Figure 2:
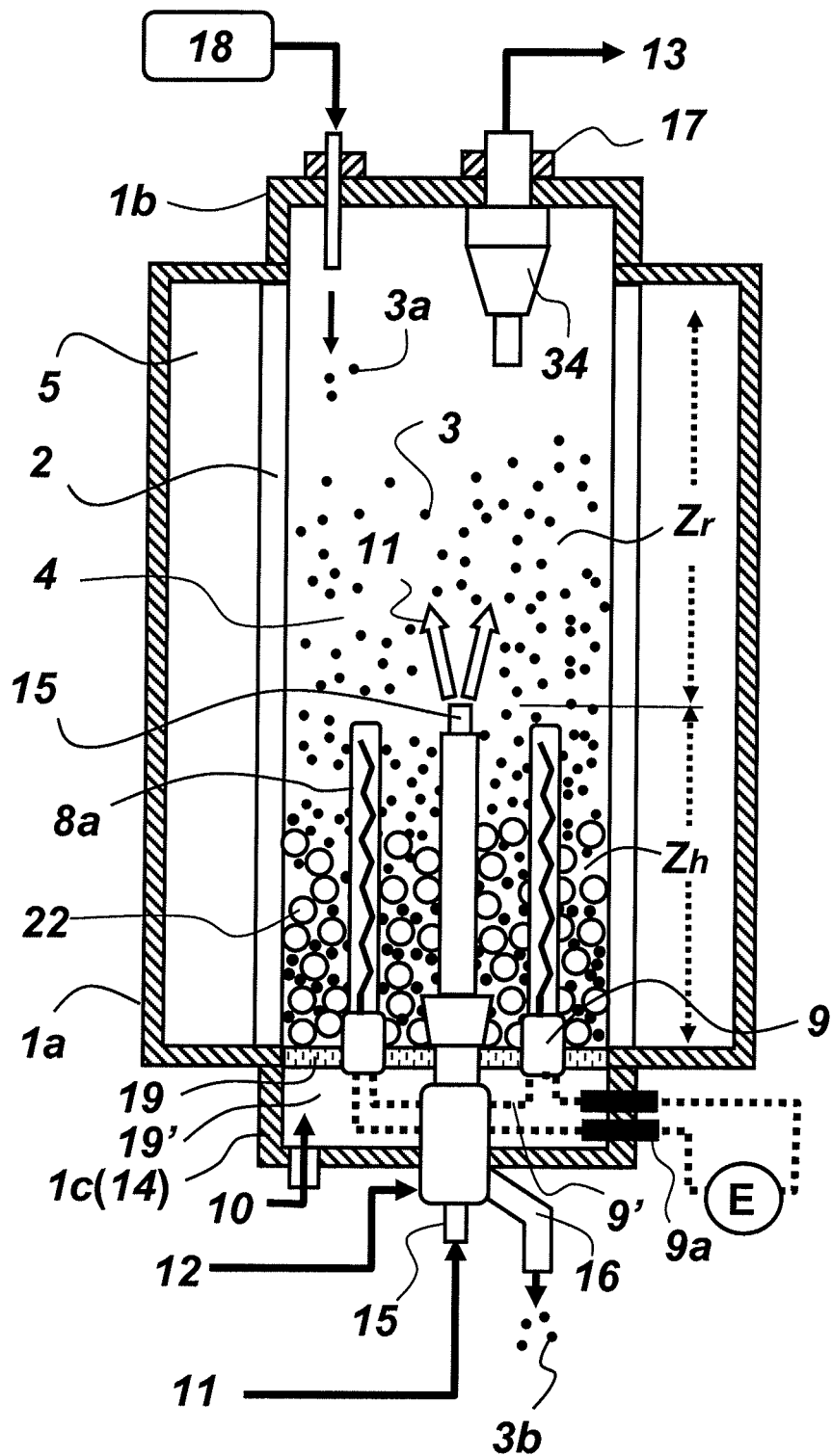
FIG. 2 also schematically illustrates a method for preparing granular polysilicon according to the present invention.

As illustrated schematically in FIG. 1 or FIG. 2, the method for preparing granular polysilicon according to the present invention is based on that the reactor tube (2) is vertically installed inside the reactor shell (1), silicon particles (3) are present within the reactor tube (2), and its inner space comprises the reaction zone ($Z_r$) and the heating zone ($Z_h$).

The gas supplied to the fluidized bed reactor of the present invention comprises the fluidizing gas (10) which flows from the fluidizing gas supplying means (14) equipped at the bottom of the bed of silicon particles through the heating zone ($Z_h$) to the reaction zone ($Z_r$), and the reaction gas (11) which is supplied from the reaction gas supplying means (15) through the reaction gas outlet to the reaction zone ($Z_r$).

Further, in the fluidized bed reactor of the present invention, the reaction gas outlet of the reaction gas supplying means (15), that is installed for supplying the reaction gas (11) required for silicon deposition into the bed of silicon particles which is formed on the fluidizing gas supplying means (14) that supplies the fluidizing gas (10), are located higher than the fluidizing gas outlet of the fluidizing gas supplying means (14), so that the upper and lower spaces in the inner zone (4) of the reactor tube (2) can be respectively defined as the reaction zone ($Z_r$) and the heating zone ($Z_h$).

Since the reaction gas (11) flowing inside the reaction gas supplying means (15) should be at a temperature lower than the incipient decomposition temperature, which ranges about from 300 to 350° C., the temperature of the reaction gas (11) supplied to the reaction zone ($Z_r$) should be lower than the reaction temperature for silicon deposition, which ranges from 600 to 1,200° C.

According to the present invention, the heating of the silicon particles (3) and the fluidizing gas (10) to maintain the reaction temperature is mostly performed in the heating zone ($Z_h$), which is spatially connected to the reaction zone ($Z_r$) within the reactor tube (2).

The productivity of the fluidized bed reactor for silicon deposition is determined by various reaction conditions. In any case, the temperature of the reaction zone ($Z_r$), or the temperature of the silicon particles (3) fluidizing in the reaction zone ($Z_r$), should remain within a predetermined temperature range.

Accordingly, considering the cooling of silicon particles accompanied by the supply of the reaction gas (11), the heat of reaction for silicon deposition, the heat loss to the outside of the reactor tube (2), and so forth, it is required that a lot of heat be rapidly transferred from the heating zone ($Z_h$) to the reaction zone ($Z_r$) in order to maintain the reaction temperature required for silicon deposition.

An ideal way of satisfying the need of continuous heating is to equip a heater at the reaction zone ($Z_r$) for direct heating. But, this method is practically not applicable because the silicon deposition occurs excessively on the surface of the heater because of the contact of the reaction gas (11) with the hot heater surface.

Thus, in order to improve the productivity of the fluidized bed reactor while increasing the supply of the reaction gas per unit time at predetermined reaction temperature, pressure and gas composition, it is required for the heat load of the heating zone ($Z_h$) per unit time be satisfied.

The present invention focuses on heating the fluidizing gas (10) and the silicon particles (3) through electrical resistance heating using an internal heater (8a) in the heating zone ($Z_h$) in between the reaction gas supplying means (15) and the inner wall of the reactor tube (2).

The present invention is also characterized in that the fluidizing gas (10) is supplied in a continuous manner, so that the silicon particles can be intermixed between the reaction zone ($Z_r$) and the heating zone ($Z_h$) in a continuous, fluidized state. As a result, the heat supplied to the heating zone ($Z_h$) can be rapidly transferred to the reaction zone ($Z_r$) and the reaction temperature in the reaction zone ($Z_r$) can be maintained within the predetermined reaction temperature range.

When the reaction zone ($Z_r$) is heated through the heating zone ($Z_h$) according to the present invention, it is possible to prepare large-sized silicon particles through silicon deposition in the reaction zone ($Z_r$) by supplying the reaction gas (11) with the reaction gas supplying means (15).

Most or part of the reaction gas (11) supplied to the reaction zone ($Z_r$) is converted to the reaction byproduct gas by the reaction, but some may remain as an unreacted reaction gas.

Accordingly, the off-gas passing through and leaving the reaction zone ($Z_r$) comprises the fluidizing gas (10) passing through the heating zone ($Z_h$), the unreacted reaction gas (11), the reaction byproduct gas, etc. and it is required to discharge the off-gas (13) out of the fluidized bed reactor using the gas discharging means (17), so that it is not accumulated inside the inner zone (4).

Figure 3:
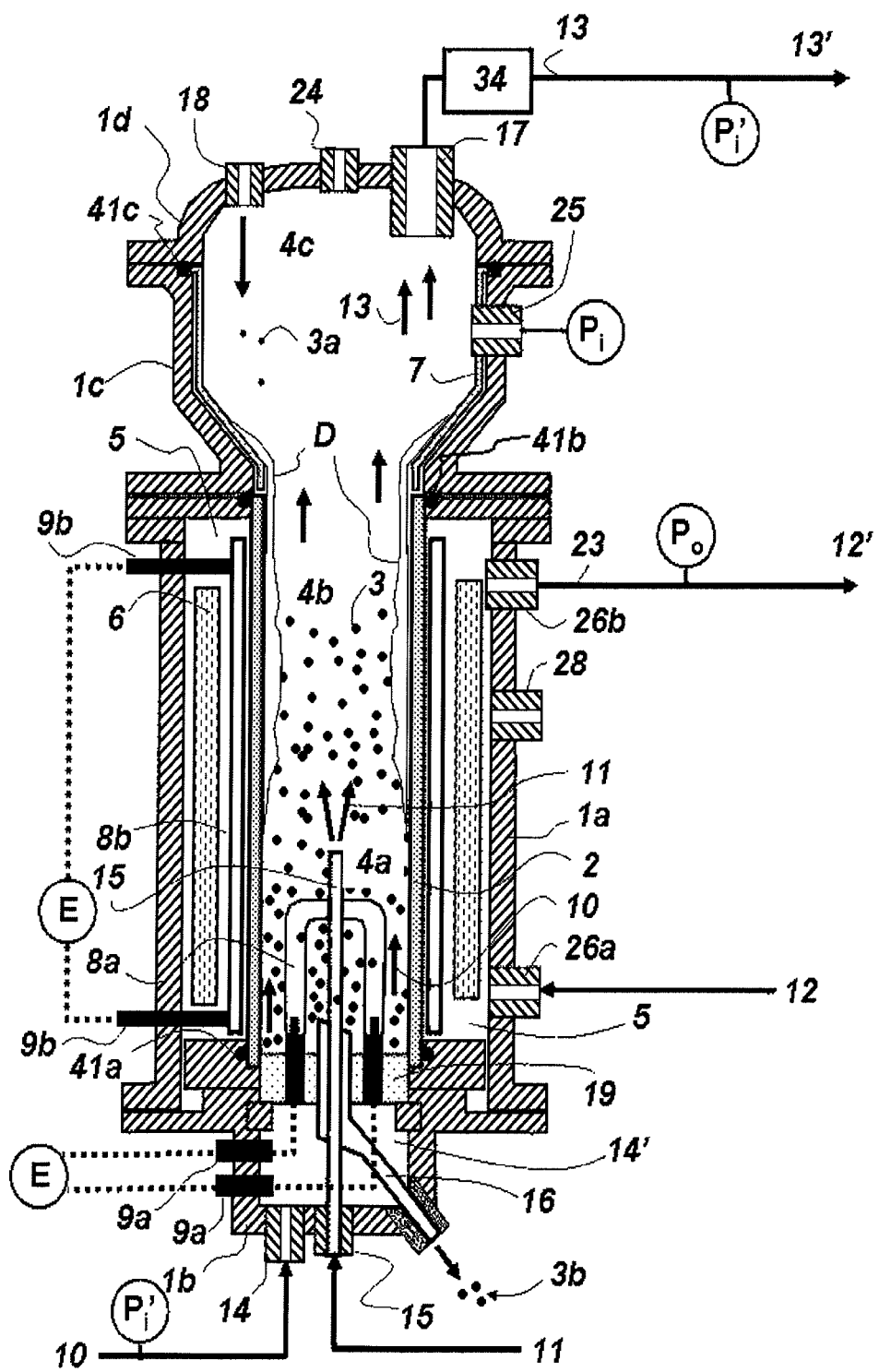
FIG. 3 schematically illustrates the construction of a fluidized bed reactor for preparing granular polysilicon according to the present invention.

Fine silicon powders or high-molecular-weight reaction byproducts carried by the off-gas (13) are separated by an off-gas treating means (34). The off-gas treating means (34) may consist of a cyclone, a filter, a packing tower, a scrubber, a centrifuge, or a combination thereof. As illustrated in FIG. 2 or FIG. 3, it may be equipped at the upper space (4c) of the inner zone of the reactor shell (1) or outside the reactor shell (1) separately from the fluidized bed reactor.

The silicon powders separated by the off-gas treating means (34) may be utilized for other purposes or may be recycled into the reactor inner zone (4) as the seed crystals (3a) for the preparation of silicon particles.

As silicon deposition proceeds, the average size of the silicon particles (3) and the height of the bed increase. Thus, in order to prepare granular polysilicon continuously or semi-continuously while maintaining the bed of silicon particles within an allowed range, it is required to discharge a part of the silicon particles (3) out of the fluidized bed reactor as silicon product particles (3b) using the particle discharging means (16).

As described above, the present invention provides a method for preparing polysilicon using a fluidized bed reactor in which a reaction gas outlet of a reaction gas supplying means (15), that supplies a reaction gas (11) required for silicon deposition into a bed of silicon particles which is formed on a fluidizing gas supplying means (14) that supplies a fluidizing gas (10) inside a reactor tube (2) installed vertically in a reactor shell (1), is located higher than a fluidizing gas outlet of the fluidizing gas supplying means (14), so that the upper and lower spaces in the inner zone (4) of the reactor tube (2) can be respectively defined as a reaction zone ($Z_r$) and a heating zone ($Z_h$), with the height of the reaction gas outlet being selected as the reference height, and which comprises the steps of: heating the fluidizing gas (10) and the silicon particles (3) through electrical resistance heating in the heating zone ($Z_h$) using an internal heater (8a) installed in the space in between the reaction gas supplying means (15) and the inner wall of the reactor tube (2); supplying the fluidizing gas (10) at such a rate that the silicon particles can be intermixed between the reaction zone ($Z_r$) and the heating zone ($Z_h$) in a continuous, fluidized state, thereby maintaining the reaction temperature of the reaction zone ($Z_r$) within a predetermined reaction temperature range; supplying the reaction gas (11) using the reaction gas supplying means (15), so that silicon particles can grow in size by silicon deposition in the reaction zone ($Z_r$); discharging an off-gas (13) comprising the fluidizing gas (10) passing through the reaction zone ($Z_r$), an unreacted reaction gas (11) and a reaction byproduct gas out of the fluidized bed reactor using a gas discharging means (17); and discharging a part of the silicon particles (3) out of the fluidized bed reactor as silicon product particles (3b) using a particle discharging means (16).

In the heating zone ($Z_h$), the silicon particles (3) and the fluidizing gas (10), which flows upward, are heated by the internal heater (8a). Therefore, the temperature increases with height.

In general, the fluidizing gas (10) may be supplied to the fluidizing gas supplying means (14) after being preheated by a preheater equipped outside the fluidized bed reactor or a gas preheating means may be equipped at the fluidizing gas supplying means (14). Alternatively, it is possible to supply the fluidizing gas (10) at room temperature to the heating zone ($Z_h$) and make it heated with the internal heater (8a). Considering impurity contamination, heat loss problem, etc., the fluidizing gas (10) may be preheated to about 200-300° C. or lower.

Without regard to the preheating, the fluidizing gas (10) needs to be heated to the reaction temperature or above while passing through the heating zone ($Z_h$). Accordingly, the heat load of the internal heater (8a) increase as the amount of the fluidizing gas (10) increases.

In supplying the fluidizing gas (10), so that the silicon particles are intermixed between the reaction zone ($Z_r$) and the heating zone ($Z_h$) in a continuous, fluidized state according to the present invention, the flow rate of the fluidizing gas at the top of the heating zone ($Z_h$), or the $u_h$ (cm/sec) value, should be at least higher than the minimum fluidization velocity ($u_{mf}$) of the silicon particles with average size.

For this purpose, the amount of the fluidizing gas (10) supplied to the bottom of the heating zone ($Z_h$) per unit time, or the F (moles/sec) value, may be increased to supply more heat from the heating zone ($Z_h$) to the reaction zone ($Z_r$).

However, if F (moles/sec) value increases excessively despite insufficient heat load of the internal heater (8a), it becomes difficult to heat the fluidizing gas (10) to the reaction temperature or above.

Even when the fluidizing gas (10) is sufficiently heated because the internal heater (8a) has a sufficient heat load, the reaction gas (11) may be mixed with the superfluous fluidizing gas (10), resulting in slugging or other problems because of unnecessarily high degree of fluidization of the silicon particles in the reaction zone ($Z_r$), and thereby leading to deterioration in silicon deposition reaction.

In order to attain the required value of $u_h$ (cm/sec) at the top of the heating zone ($Z_h$) with a small F value, the inner diameter of the reactor tube (2) surrounding the heating zone ($Z_h$) may be decreased. But, in this case, the space for installing the internal heater (8a), the reaction gas supplying means (15), the particle discharging means (16), etc., may not be sufficient.

Further, a small F value may result in insufficient fluidization of the silicon particles in the heating zone ($Z_h$), particularly at the relatively cooler bottom space, insufficient heating of the fluidizing gas (10) and the silicon particles (3) by the internal heater (8a) and nonuniform flow of the fluidizing gas (10).

In order to reduce the F value while minimizing these problems, it is required to rapidly transfer the heat supplied into the heating zone ($Z_h$) to the reaction zone ($Z_r$) while minimizing the cross-sectional space for the flow of the fluidizing gas (10) in the inner space of the heating zone ($Z_h$).

As illustrated schematically in FIG. 2, a packed bed may be formed in a part of or all of the space, which is comprised in the heating zone and enclosed by the inner wall of the reactor tube (2), the fluidizing gas supplying means (14), the reaction gas supplying means (15) and the internal heater (8a), using packing materials (22) that are not fluidized by the flow of the fluidizing gas (10), so that the fluidizing gas (10) can be heated while passing through the packed bed.

The packed bed formed in the heating zone ($Z_h$) using the packing materials (22) ensures that the fluidizing gas (10) is distributed substantially uniformly and the chance of the contact of the silicon particles (3) with the fluidizing gas (10) increases in the space formed in between the packing materials (22).

Further, the packing materials (22) increase the surface area of the internal heater (8a), thereby enabling more effective heating of the silicon particles (3) and the fluidizing gas (10) and minimizing heat transfer from the hot heating zone ($Z_h$) to the bottom of the reactor shell (1).

Further, as illustrated schematically in FIG. 2, the silicon particles may be discharged intermittently, periodically or continuously from the heating zone ($Z_h$) out of the fluidized bed reactor as the silicon product particles (3b) as required during the silicon deposition process, after residing in or moving through a space formed between the packing materials (22).

This greatly increases the chance that the silicon product particles (3b) are cooled by the fluidizing gas (10) supplied at the bottom of the heating zone ($Z_h$) by the fluidizing gas supplying means (14), thereby relieving the load of further cooling the silicon product particles (3b).

It is impossible to specify a single temperature of the reaction zone ($Z_r$) where the silicon particles are fluidized continuously and thereby temperature fluctuation is observed. It is thus required to deal with the reaction temperature in terms of a predetermined, allowable range instead of a specific value.

According to the present invention, the internal heater (8a) should be capable of heating the silicon particles (3) and the fluidizing gas (10) in the heating zone ($Z_h$), so that the reaction temperature at the reaction zone ($Z_r$) can be maintained at a temperature of from 600 to 1,200° C.

More specific reaction temperature range may be easily predetermined from preliminary experiments with various pressure and temperature, components and composition, supply rate and preheating temperature of the fluidizing gas (10) and reaction gas (11), reaction temperature measuring standard, and so forth.

The reaction temperature may be measured in a variety of ways. For example, the temperature inside the reaction zone ($Z_r$), the outer wall of the reactor tube (2) or the top of the reactor may be directly measured using such a measuring instrument as thermocouple or pyrometer. Alternatively, the reaction temperature may be estimated indirectly by analyzing the composition of the off-gas (13).

In order to maintain the reaction temperature in the reaction zone ($Z_r$) within a predetermined range, it is preferred to heat the fluidizing gas (10) and the silicon particles (3) in the heating zone ($Z_h$) to a temperature higher than the reaction temperature.

For electric heating of the heating zone ($Z_h$), the internal heater (8a) may comprise one or a plurality of heater units, each heater unit comprising a resistive element at which electrical resistance heating occurs.

Figure 5:
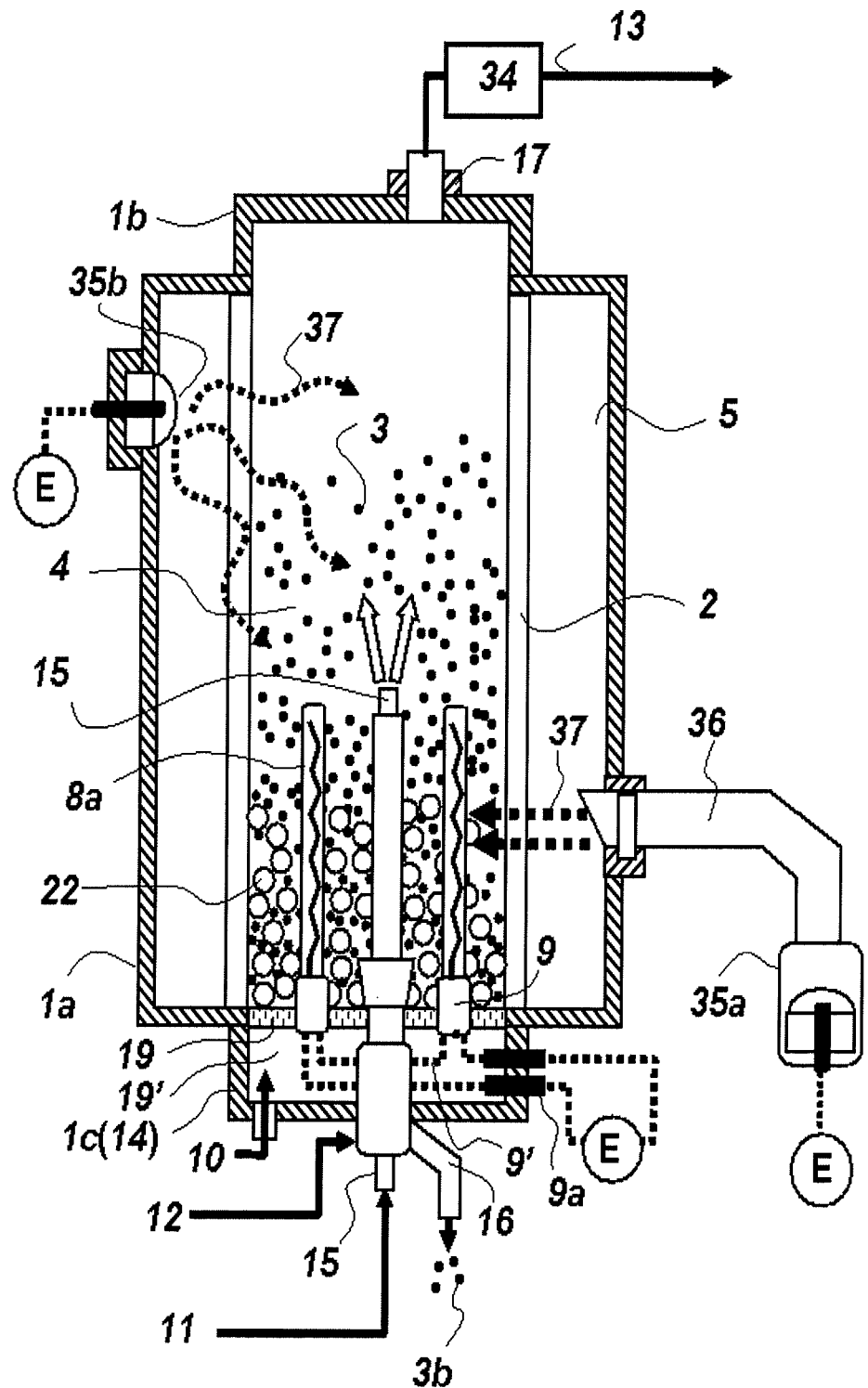
FIG. 5 schematically illustrates the construction of a fluidized bed reactor for preparing granular polysilicon according to the present invention in which a microwave generator is further added to the inner zone.

FIGS. 1, 2 and 5 respectively illustrate an internal heater (8a) comprising two heater units. If more space is available, more heater units may be installed to increase heat load.

Since the respective heater unit has to be in contact with the hot silicon particles (3) and the fluidizing gas (10) in the bed of silicon particles, it is important to minimize or prevent the contamination of the particles by the resistive element (38) for the preparation of high-purity polysilicon.

To prevent or minimize the contamination of the silicon particles (3) by the resistive element (38) in the present invention, (i) the resistive element (38) is installed a protection tube (40); (ii) one or a plurality of separation layers (39), each made of a different barrier component, is formed on the surface of the resistive element (38); or (iii) a protection tube (40) is formed outside the resistive element (38) on which a separation layer (39) has been formed.

Since the temperature at the top of the heating zone ($Z_h$) is higher than that of the fluidizing gas outlet of the fluidizing gas supplying means (14), the silicon particles at the bottom of the heating zone ($Z_h$) may not be fluidized even though the fluidizing gas (10) is supplied at such a flow rate that the silicon particles are intermixed between the reaction zone ($Z_r$) and the heating zone ($Z_h$) in a continuous, fluidized state, according to the present invention.

In the present invention, fluidization of the silicon particles (3) means that the spatial location of the silicon particles can be changed for a short period of time caused by gas flow, movement or change of gas bubbles and/or movement of neighboring particles.

An unreactive gas that does not react apparently with the silicon particles is generally used for the fluidizing gas (10), which may be selected from hydrogen, nitrogen, argon, helium, or a mixture thereof.

The fluidizing gas (10) may further comprise a denser and more viscous gas component than the unreactive gas components. Specifically, Si—H—Cl-based chlorine compounds such as tetrachlorosilane ($SiCl_4$), trichlorosilane ($SiHCl_3$), dichlorosilane ($SiH_2Cl_2$), hydrogen chloride (HCl), etc., may be used for that purpose.

When the fluidizing gas (10) comprises an unreactive gas and a chlorine component, it is necessary to determine the allowed concentration range of the chlorine compound through thermodynamic equilibrium analysis or preliminary experiments in order to avoid apparent occurrence of silicon deposition or silicon etching between the high-purity silicon particles (3) and the fluidizing gas (10) within the temperature range that can be attained in the heating zone ($Z_h$).

Accordingly, the fluidizing gas (10) used in the present invention may comprise one or a plurality of components selected from hydrogen, nitrogen, argon, helium, tetrachlorosilane, trichlorosilane, dichlorosilane, and hydrogen chloride.

The reaction gas (11) supplied into the reaction zone ($Z_r$) is the source of silicon elements which form the granular polysilicon product through silicon deposition, and thus, should comprise a silicon-containing component.

The reaction gas (11) used in the present invention may comprise one or a plurality of components selected from monosilane ($SiH_4$), dichlorosilane ($SiH_2Cl_2$), trichlorosilane ($SiHCl_3$) and tetrachlorosilane ($SiCl_4$) as the silicon-containing component.

Although the reaction gas (11) used in the present invention may comprise only the aforementioned silane compound, etc. as silicon deposition source, it may further comprise at least one selected from the group consisting of hydrogen, nitrogen, argon, helium, hydrogen chloride (HCl), and a mixture thereof. Therefore, the reaction gas (11) provides the source of silicon deposition, contributes to the fluidization of the silicon particles (3) in the reaction zone ($Z_r$) along with the fluidizing gas (10).

In a continuous or semi-continuous preparation of granular polysilicon according to the present invention, it is required to maintain the number and average particle size of the silicon particles (3) constituting the fluidized bed within a certain range. Thus, it is preferable to supply seed crystals (3a) to the inner zone (4) of the reactor tube (2) corresponding to the number of the silicon product particles (3b) discharged as product.

As described above, some of the silicon particulates or powders separated by the off-gas treating means (34) may be recycled as seed crystal. But, since the amount is limited and the size is too small, further preparation of silicon seed crystals is inevitable for the continuous production of the silicon product.

In this regard, it can be considered to separate small-sized product particles from the product particles (3b) and use them as seed crystals (3a). But, the process of separating small-sized seed crystals (3a) from the product particles (3b) outside the fluidized bed reactor is complicated and requires careful treatment because of the possibility of impurity contamination.

Instead of such an additional process of separating the product particles (3b), it is also possible to include a classifying means along the particle discharge path of the particle discharging means (16), so that the product particles (3b) can be cooled by the gas flowing upward while the small-sized silicon particles return back to the bed of silicon particles, thereby reducing the burden of seed crystal supply, increasing the average particle size of the product particles (3b) and narrowing the particle size distribution.

A general method of preparing seed crystals (3a) from the silicon product particles (3b) are pulverizing some of the silicon product particles (3b) discharged through the particle discharging means (16) using a pulverizing apparatus. The resultant silicon seed crystals (3a), which have been prepared outside the fluidized bed reactor, may be supplied into the reactor tube using a seed crystal supplying means (18).

As illustrated in FIG. 2, the seed crystal supplying means (18) installed as coupled with the reactor shell (1b) enables a continuous, periodical or intermittent supply of the seed crystals (3a) to the inner zone (4) of the reactor when required. This is advantageous in that the size and feeding rate of the seed crystals (3a) can be controlled as required, but an additional pulverizing apparatus is needed.

In contrast, a high-speed gas jet may be generated inside the bed of silicon particles using a reaction gas supply nozzle equipped at the reaction gas supplying means (15), a fluidizing gas supply nozzle equipped at the fluidizing gas supplying means (14) or a particle pulverizing gas nozzle equipped separately in order to pulverize the silicon particles inside the bed of silicon particles into seed crystals.

Such a method of preparing the seed crystals (3a) in the inner zone (4) is advantageous in that the silicon particles are pulverized easily even at sub-ultrasonic gas velocity at the gas nozzle outlet because the temperatures of silicon particles are sufficiently high for easy pulverization. This method is advantageous in that the seed crystals (3a) can be prepared economically in the bed of silicon particles without impurity contamination, thereby not necessitating a pulverizing apparatus. However, it is difficult to control the size and preparation rate of the seed crystals (3a) as required and it is probable that fine powders that cannot be utilized as seed crystals (3a) may be generated in large amount.

As described above, there are advantages and disadvantages in the respective method of preparation and supply of the silicon seed crystals (3a). Preferably, the seed crystals (3a) have an average size of about 0.2-0.8 mm, which amounts to a half or is smaller than the size of the product particles (3b).

If the average size of the seed crystals (3a) is smaller than 0.2 mm, the amount of the seed crystals (3a) to be supplied may be reduced, but the seed crystals (3a) may be easily carried away by the fluidizing gas (10), reaction gas (11) or off-gas (13). In contrast, if the average size is larger than 0.8 mm, an excessively large amount of seed crystals (3a) has to be supplied.

In order to improve the growth rate of the silicon particles (3) in the reaction zone ($Z_r$), thereby to maximize the production rate of the product particles (3b), the reaction temperature in the reaction zone ($Z_r$) should be maintained within a predetermined reaction temperature.

For this purpose, it is required to set up the feeding rate of the fluidizing gas (10) to the heating zone ($Z_h$) per unit time, or the F (mole/sec) value, so that the silicon particles can be intermixed between the reaction zone ($Z_r$) and the heating zone ($Z_h$) in a continuous, fluidized state without excessive feeding rate.

The degree of the fluidization of the particles in the bed of silicon particles are determined not only by the temperature but also by the feeding rate of the reaction gas (11). Thus, it is preferable to set the flow rate (u; cm/sec) of the fluidizing gas (10) at the flow rate ($u_{mf}$) of the minimal fluidized state within the reaction temperature range without supplying the reaction gas (11). This corresponds to the case when the F value is represented by $F_{mf}$.

According to the present invention, it is preferable that the feeding rate (F; mole/sec) of the fluidizing gas (10) to the heating zone ($Z_h$) per unit time be within the range of 1.0-5.0 times the feeding rate ($F_{mf}$) at the minimal fluidized state at which the silicon particles in the reaction zone ($Z_r$) begins to be fluidized within the reaction temperature range without supply of the reaction gas.

If the F value is smaller than $F_{mf}$, the feeding rate of the fluidizing gas (10) and the heat load of the internal heater (8a) decrease, but the heating rate of the heating zone ($Z_h$) decreases and intermixing of the particles in the two zones ($Z_h$, $Z_r$) becomes insufficient, thereby reducing heat transfer efficiency and making it difficult to maintain the reaction temperature.

In contrast, if the F value is larger than 5 $F_{mf}$, the heating rate of the heating zone ($Z_h$) may increase, but the heat load of the internal heater (8a) increases and the efficiency of silicon deposition decreases greatly because of slugging caused by the excessively high gas flow rate in the reaction zone ($Z_r$).

The reaction gas supplying means (15) installed in the bed of silicon particles may be constructed with a variety of structure, as long as it can stably supply the reaction gas (11) to the reaction zone ($Z_r$).

For example, the reaction gas supplying means (15) may comprise only a tube type reaction gas nozzle equipped in the heating zone ($Z_h$). If the wall of the nozzle is heated by the radiation by the internal heater (8a) or the contact with hot silicon particles (3), the inner wall temperature of the nozzle should be maintained higher than about 300-350° C., which is the incipient decomposition temperature. This naturally causes silicon deposition and its accumulation on the inner wall of the nozzle. Also, if being installed in the form of a single tube, the nozzle may be damaged by the impact and/or vibration caused by the fluidization of the silicon particles (3).

Figure 4:
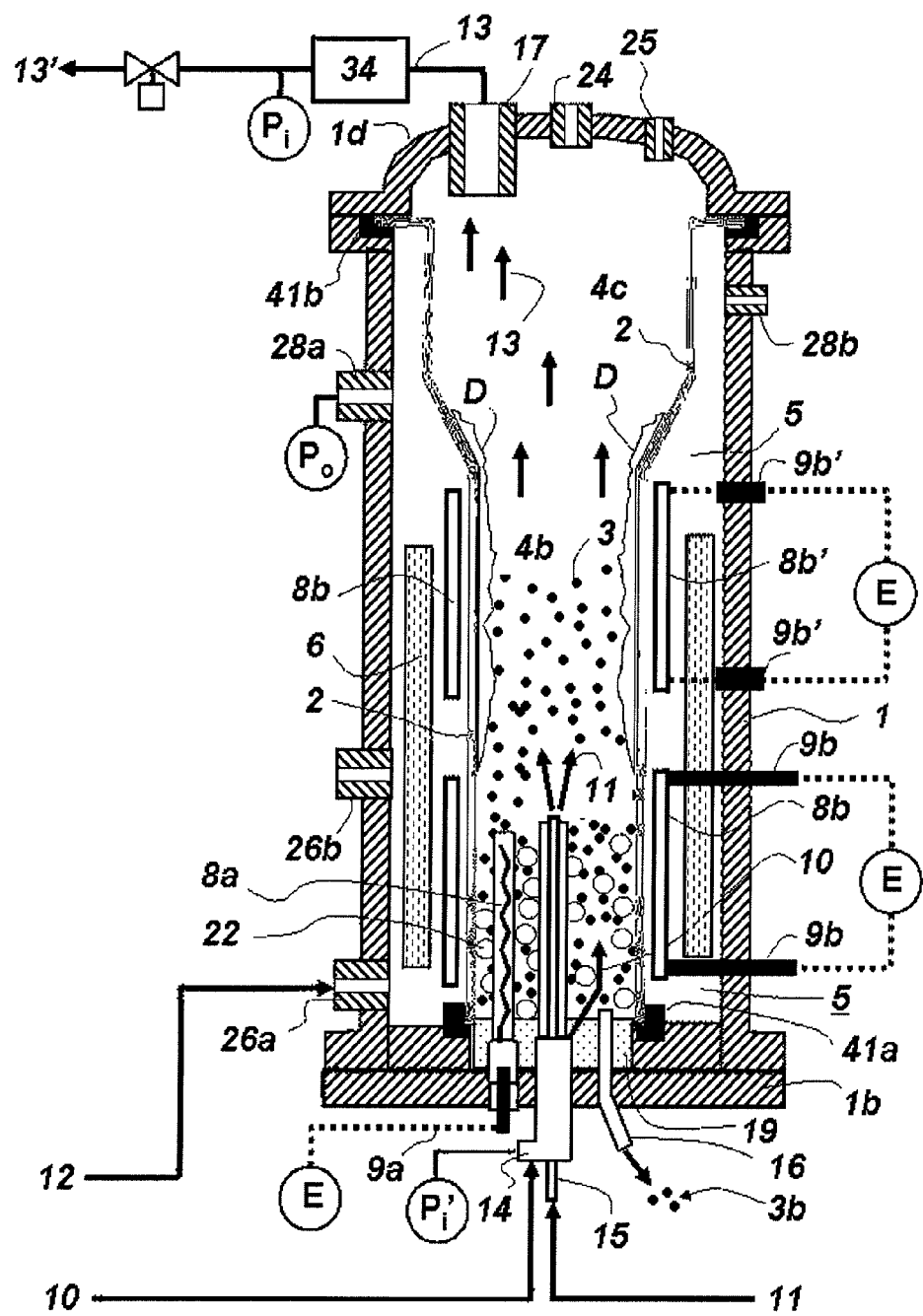
FIG. 4 also schematically illustrates the construction of a fluidized bed reactor for preparing granular polysilicon according to the present invention.

To prevent these problems, the reaction gas supplying means (15) may comprise a reaction gas nozzle for supplying the reaction gas (11) and one or a plurality of nozzles in a coaxial multitube structure, as illustrated schematically in FIG. 2 or FIG. 4. One or a plurality of nozzles surrounds the reaction gas nozzle and offers protection of the reaction gas nozzle.

As illustrated in FIG. 2, the inert gas (12) comprising one or a plurality of components selected from hydrogen, nitrogen, argon and helium may be introduced as a gas for protecting the reaction gas nozzle along the center of the coaxial multitube, in order to prevent the accumulation of silicon deposit on the inner wall of the reaction gas nozzle and complement mechanical vulnerability.

The feeding rate of the gas for protecting the reaction gas nozzle can be very low compared with those of the fluidizing gas (10) or the reaction gas (11). Even when silicon particles are present at an annular region of the coaxial multitube, the gas for protecting the reaction gas nozzle can prevent unwanted overheating of the reaction gas nozzle.

Further, it is also possible to prevent the accumulation of silicon deposit at the outlet of the reaction gas nozzle or to remove the already formed silicon deposit by adding hydrogen chloride (HCl) continuously, intermittently or periodically to the inert gas (12) supplied to the gas for protecting the reaction gas nozzle. If too much hydrogen chloride is supplied for this purpose, even the silicon particles (3) in the heating zone ($Z_r$) may also be gasified to chlorosilane. Thus, it is essential that the supply of hydrogen chloride be not excessive.

When the fluidized bed reactor is heated by the internal heater (8a) equipped inside the heating zone ($Z_h$) according to the present invention, more heat can be supplied to the reaction zone ($Z_r$) compared with the conventional heating method. Accordingly, the productivity of the fluidized bed reactor can be improved significantly by increasing the feeding rate of the reaction gas (11) per unit time under high pressure.

For silicon deposition under high pressure, in addition to the improvement of heating method, it is required to ensure the mechanical stability of the fluidized bed reactor, particularly the mechanical stability of the reactor tube (2), which is exposed to the hot silicon particles in the fluidized bed.

In the present invention, for silicon deposition under high pressure, the fluidized bed reactor is constructed such that the reactor tube (2) is installed vertically inside the reactor shell (1), so that the reactor tube (2) is enclosed by the reactor shell (1), as illustrated schematically in FIG. 2, FIG. 3 and FIG. 4. Consequently, the inner space of the reactor tube is defined as an inner zone (4) where a bed of silicon particles (3) is present and both the heating zone ($Z_h$) and the reaction zone ($Z_r$) are included. Further, the outer zone (5) is defined as the space in between the reactor tube (2) and the reactor shell (1), where the bed of silicon particles is not present and silicon deposition does not occur.

The reason why the space inside the reactor shell (1) is divided by the reactor tube (2) is because, if the pressure difference between both sides of the reactor tube (2) is small, the mechanical stability of the reactor tube (2) can be ensured even under high reaction pressure.

Further, in order to prevent the silicon particles present in the inner zone (4) from being contaminated by the impurities out of the outer zone (5) during the silicon deposition process under high pressure, an inert gas (12) selected from hydrogen, nitrogen, argon, helium, and a mixture thereof is introduced into the outer zone (5) to maintain the outer zone (5) under an inert gas atmosphere, as illustrated schematically in FIG. 3 and FIG. 5.

There is no need to supply excessive amount of inert gas (12) to maintain the outer zone (5) at a substantially inert gas atmosphere and to control the pressure.

Accordingly, the inert gas flow in the outer zone (5) can be attained by supplying a small amount of an inert gas (12) to the outer zone (5) continuously, intermittently or periodically.

According to the present invention, if the pressure of the outer zone (5) and the pressure of the inner zone (4) are expressed as the outer zone pressure (Po) and the inner zone pressure (Pi), respectively, the pressure difference between the two zones, $\Delta P=|P_o-P_i|$, is maintained within 1 bar in order to ensure the stability of the reactor tube (2) during the silicon deposition process at high reaction pressure.

In this way, the $P_i$ or $P_o$ value can be increased infinitely without impairing the stability of the reactor tube (2). However, if the absolute reaction pressure exceeds about 20 bar, the heat load required for the internal heater (8a) becomes too large for the feeding rate (mole/sec) of the fluidizing gas (10) and the reaction gas (11) per unit time, making it practically impossible to maintain the reaction temperature.

Accordingly, in the heating of the fluidized bed reactor of the present invention, it is preferable to maintain the outer zone pressure (Po) or the inner zone pressure (Pi) within the range of 1-20 bar absolute.

In the silicon deposition operation using a large-scale fluidized bed reactor with a very large-diameter reactor tube (2) under high pressure, a supplemental heaters (8b) may be equipped at the outer zone (5), in addition to the internal heater (8a) installed in the inner zone ($Z_h$), to heat the inner zone ($Z_h$) if it is difficult to maintain the reaction temperature with the internal heater (8a) only.

FIG. 3 and FIG. 4 schematically illustrate the supplemental heaters (8b) installed in the outer zone (5) in addition to the internal heater (8a) equipped at the inner zone ($Z_h$).

When the supplemental heaters (8b) are installed in the inner zone (4) for further heating during the silicon deposition, it is preferable for the heat load of the supplemental heater (8b) not to exceed 100% of the heat load of the internal heater (8a), because the supplemental heaters (8b) installed outside the reactor tube (2) has worse heating efficiency than the internal heater (8a) installed in the bed of silicon particles.

If the heat load of the supplemental heater (8b) is smaller than 10% of the heat load of the internal heater (8a), the addition of the supplemental heater (8b) does not provide significant effect in heating of the heating zone ($Z_h$) or is not considered economical.

Thus, when a supplemental heater (8b) is installed at the outer zone (5) for the use in the silicon deposition, it is preferable that the supplemental heater (8b) have a heat load in the range of from 10 to 100% of the heat load of the internal heater (8a) installed in the inner zone ($Z_h$).

But, without regard to the use of the supplemental heater (8b, 8b') during the silicon deposition, the supplemental heater (8b, 8b') may be used to heat the bed of silicon particles (3) during the start-up of the reactor prior to the supply of the reaction gas to the reaction zone ($Z_r$) and/or to selectively heat the silicon deposit (D), accumulated during the deposition operation on the inner wall of the reactor tube (2), prior to or during the silicon deposit removal process.

FIG. 3 and FIG. 4 schematically illustrate an example where silicon deposition occures on the inner wall of the reactor tube (2) surrounding the reaction zone ($Z_r$) in the form of silicon deposit (D) during the operation of silicon deposition. When the wall of the reactor tube (2) in the reaction zone ($Z_r$) is heated with the supplemental heater (8b) installed at the outer zone (5), the rate of the formation of the silicon deposit (D) becomes too fast.

Accordingly, when the supplemental heater (8b) is used, it is better to lower the height of the supplemental heater (8b) below the height of the heating zone ($Z_h$), i.e., the height of the reaction gas outlet, so that the wall of the reactor tube enclosing the reaction zone ($Z_r$) where the reaction gas (11) is present is not heated unnecessarily by the supplemental heater (8b).

Instead of installing the supplemental heater (8b) at the outer zone (5), in addition to the internal heater (8a) installed in the heating zone ($Z_h$), to supply heat to the inner zone (4), it is possible to supply electromagnetic radiation energy to the inner zone (4) to heat the silicon particles (3).

For a fluidized bed reactor with a large-diameter reactor tube (2), microwave is the most effective mode among various modes of the electromagnetic radiation energy.

When microwave (37) is utilized along with the internal heater (8a) for the heating of the inner zone (4) according to the present invention, the supply of the microwave (37) can be attained in a variety of ways.

For example, a metallic waveguide (36) which transmits the microwave (37) generated by a microwave generator (35) such as magnetron from electrical energy may be connected to the reactor shell (1). Alternatively, without using a waveguide, one or a plurality of microwave generators (35) may be installed as coupled with the reactor shell (1) to supply the microwave (37) to the inner zone (4) for heating the silicon particles (3).

As such, in addition to the internal heater ($8a$) installed in the inner space of the heating zone ($Z_h$), it is possible to heat the inner zone (4) using the microwave (37) generated outside of the reactor or inside the reactor shell (1).

For the microwave heating of the inner zone (4), the microwave (37) may be supplied from the top of the inner zone (4) into the reaction zone ($Z_r$) or transmitted through the microwave-transparent wall of the reactor tube (2) into the heating zone ($Z_h$).

Further, the microwave generator (35) or the waveguide (36) may be located at any position of the reactor shell (1), without restriction.

As illustrated schematically in FIG. 5, the microwave (37) generated by the microwave generator ($35a$) may be transmitted into the reactor through the waveguide (36) connected with the reactor shell (1) and supplied into the heating zone ($Z_h$) through the microwave-transparent wall of the reactor tube (2). Alternatively, without using the waveguide (36), the microwave may be generated inside the reactor shell (1) by the microwave generator ($35b$) installed at the outer zone (5) as coupled with the reactor shell (1) and supplied to the heating zone ($Z_h$) and/or the reaction zone ($Z_r$) through the wall of the reactor tube (2).

The microwave heating may be utilized, without regard to the installation or utilization of the supplemental heater ($8b$) at the outer zone (5), to heat the bed of silicon particles (3) during the start-up of the reactor prior to the supply of the reaction gas to the reaction zone ($Z_r$) or to selectively heat the silicon deposit (D), accumulated during the deposition operation on the inner wall of the reactor tube (2), prior to or during the silicon deposit removal process.

Hereinafter, the fluidized bed reactor for preparing granular polysilicon to attain the object of the present invention is descried in detail referring to the attached drawings.

In the fluidized bed reactor of the present invention, the inner space of the reactor is isolated from the outer space of the reactor by the reactor shell (1).

The reactor shell (1) encloses the reactor tube (2) which is installed vertically in the inner space of the reactor.

Preferably, the reactor shell (1) is made of at least one metal selected from carbon steel and stainless steel or various alloys further comprising a transition metal element, and thus, has superior mechanical strength and good processability.

The reactor shell (1) may consist of several components as exemplified as $1a$, $1b$, $1c$, $1d$, etc. in FIGS. 1 to 4, considering equipment fabrication, assembly and disassembly.

It is important to assemble the components of the reactor shell (1) using gaskets or sealing materials, so that the inside of the reactor can be completely isolated from the outside space.

Each component of the reactor shell (1) may have various forms, including a cylindrical pipe, a flange, a tube and fitting, a plate, a cone, an ellipsoid or a jacket.

Each metallic component may be equipped with a protection coat, liner or protection wall in the inner surface. The protection coat, liner or protection wall may be made of metallic material or non-metallic material such as organic polymer, ceramic, quartz, etc.

As exemplified as $1a$, $1b$, $1c$, $1d$, etc., in FIGS. 1 to 4, some of the components of the reactor shell (1) are preferably maintained at a temperature below a predetermined range using such cooling medium as water, oil, gas, air, etc., for the purpose of apparatus protection, prevention of thermal expansion, operator protection, prevention of accidents, etc.

Although not illustrated in the figure, the components of the reactor shell (1) that need cooling may be designed such that the cooling medium can be circulated inside or outside the components. Instead of such cooling, an insulating material may be further equipped at the outer surface of the reactor shell (1) for the purpose of operator protection and prevention of excessive heat loss.

The reactor tube (2) used in the present invention may be in any form as long as it can be fixed by the reactor shell (1).

The reactor tube (2) may be a simple straight tube, as illustrated in FIGS. 1 to 3, or a structure comprising tubal, conical and/or ellipsoidal parts. As illustrated schematically in FIG. 4, one end of the reactor tube may be processed in the form of a flange. In addition, the reactor tube (2) may consist of a plurality of parts, some of which may be in the form of a liner equipped on the inner wall of the reactor shell (1).

Preferably, the reactor tube (2) is made of an inorganic material that can endure deformation at high temperature. The material may be made of a single component material or a plurality of materials selected from the group consisting of quartz, silica, silicon nitride, boron nitride, silicon carbide, graphite, glassy carbon, silicon, and a mixture thereof.

Since such carbon-containing materials as silicon carbide, graphite, glassy carbon, etc., may contaminate the polysilicon particles, a plurality of layers may be formed in the thickness direction of the reactor tube (2) by coating or lining the inner wall of the reactor tube (2), which may contact the silicon particles (3, $3a$, $3b$), with such material as silicon, silica, quartz, silicon nitride, etc., when carbon-containing materials are used for the reactor tube.

Accordingly, the reactor tube (2) used in the present invention may consist of a material in the form of a single component material, i.e., a single layer or of a plurality of layers in the thickness direction each layer of which is made of a different material.

In the inner zone (4) of the reactor tube (2), the bed of silicon particles are formed on the fluidizing gas supplying means (14) which supplies the fluidizing gas (10).

The silicon particles (3) have various forms, including a sphere, a spheroid, a polyhedron, a bead, a granule, a chip, a fragment, etc.

The seed crystals ($3a$) that can be obtained by pulverizing the silicon particles (3) is mainly in the form of a semi-sphere, a semi-ellipsoid, a semi-polyhedron, a chip or a fragment with sharp edges. But, as silicon deposition proceeds, the particle size increases and the sharp edges become smoother. If the particle size grows further through prolonged silicon deposition, the particles ultimately become similar to spherical.

Since it is required to supply the reaction gas (11) for silicon deposition into the bed of silicon particles, a part of the reaction gas supplying means (15) for supplying the reaction gas (11), which is coupled with the reactor shell (1), needs to be extended to the inside of the bed of silicon particles.

The reaction gas supplying means (15), which may comprise one or a plurality of identical reaction gas supplying units, has to be connected also with reaction gas preparing and/or storing and/or supplying system located outside the reactor.

Accordingly, the reaction gas supplying means (15) of the present invention further comprises, in addition to the part located in the bed of silicon particles, the part located outside of the reactor tube (2) and/or in the inner and outer space of the reactor shell (1).

In the reaction gas supplying means (15), the part located in the bed of silicon particles may be connected with the reactor tube (2) vertically or obliquely.

However, considering the mechanical stability of the reactor tube (2) and the reaction gas supplying means (15) and the easiness of assembly and disassembly of the reactor, the reaction gas supplying means (15) is preferably installed vertically in the bed of silicon particles.

One or a plurality of reaction gas outlets equipped at the reaction gas supplying means (15) are positioned above one or a plurality of fluidizing gas outlets equipped at the fluidizing gas supplying means (14).

Consequently, the inner zone (4) of the reactor tube (2) may be divided into upper and lower spaces with the reaction gas outlet as the reference height. The upper and lower spaces in the inner zone (4) are defined the reaction zone ($Z_r$) and the heating zone ($Z_h$), respectively.

In the fluidized bed reactor of the present invention, silicon deposition occurs during the silicon deposition process on the surface of the silicon particles (3) in the reaction zone ($Z_r$) where the reaction gas (11) is present and the fluidizing gas (10) and the silicon particles (3) are heated in the heating zone ($Z_h$) where the fluidizing gas (10) flows.

As such, the reaction zone ($Z_r$) and the heating zone ($Z_h$) are different in their functions according to the construction of the inner zone (4), and defined based on height in the inner space of the reactor tube (2). Thus, no mechanical means other than the reaction gas supplying means (15) is required to physically separate the two zones.

Accordingly, the fluidizing gas (10) supplied by the fluidizing gas supplying means (14) at the bottom of the heating zone ($Z_h$) passes through the heating zone ($Z_h$) and flows upward to the reaction zone ($Z_r$).

In the present invention, a space formed in between the reactor tube (2), the internal heater (8a) and the reaction gas supplying means (15), wherein the fluidizing gas (10) and the silicon particles (3) are heated by electrical resistance heating of the internal heater (8a) so that particle intermixing between the reaction zone and the heating zone is maintained in a continuous, fluidized state. Thus, the internal heater (8a) which heats the fluidizing gas (10) and the silicon particles (3) is installed in between the reaction gas supplying means (15) and the inner wall of the reactor tube (2), with the height of the internal heater (8a) not being higher than the height of the reaction gas outlet. Consequently, the internal heater (8a) does not directly contact the reaction gas (11) and silicon is not deposited or accumulated on the hot surface of the internal heater (8a).

In continuous or semi-continuous preparation of polysilicon using a fluidized bed reactor, it is required to discharge the gases supplied to the reactor and the gases generated from the deposition, so that they cannot be accumulated inside the reactor tube (2).

Similarly, it is required to discharge a part of the silicon particles (3) prepared within the reactor tube (2) by silicon deposition out of the reactor as silicon product particles (3b), so that excessive silicon particles (3) cannot be accumulated inside the reactor tube (2).

Thus, a gas discharging means (17) which discharges the off-gas (13) comprising the fluidizing gas (10) passing through the reaction zone ($Z_r$), unreacted reaction gas (11) and reaction byproduct gas out of the fluidized bed reactor and a particle discharging means (16) which discharged part of the silicon particles (3) prepared within the reactor tube (2) by silicon deposition out of the fluidized bed reactor as silicon product particles (3b) are required.

As described above, the fluidized bed reactor of the present invention comprises: a reactor tube (2); a reactor shell (1) enclosing the reactor tube (2); a fluidizing gas supplying means (14) for supplying a fluidizing gas (10) to the bottom of a bed of silicon particles formed within the reactor tube (2); a reaction gas supplying means (15) installed vertically within the bed of silicon particles (3) for supplying a reaction gas (11) required for silicon deposition into the bed of silicon particles (3), so that the reaction gas outlet of the reaction gas supplying means (15) can be located higher than the fluidizing gas supplying means (14); an internal heater (8a) installed in a space in between the reaction gas supplying means and the inner wall of the reactor tube (2); a reaction zone ($Z_r$) and a heating zone ($Z_h$), which represent the upper and lower spaces in the reactor tube (2), respectively, with the height of the reaction gas outlet being selected as the reference height; a space formed in between the reactor tube (2), the internal heater (8a) and the reaction gas supplying means (15), wherein the fluidizing gas (10) and the silicon particles (3) are heated by electrical resistance heating of the internal heater (8a) so that particle intermixing between the reaction zone ($Z_r$) and the heating zone ($Z_h$) is maintained in a continuous, fluidized state; a gas discharging means (17) for discharging an off-gas (13) comprising the fluidizing gas (10) passing through the reaction zone ($Z_r$), an unreacted reaction gas and a reaction byproduct gas out of the fluidized bed reactor; and a particle discharging means (16) for discharging a part of the silicon particles (3) prepared in the reactor tube by the silicon deposition out of the fluidized bed reactor as silicon product particles (3b).

As aforementioned, a packed bed may be formed with packing materials (22) that are not fluidized by the flow of the fluidizing gas (10) in part or all of the heating zone ($Z_h$), so that the fluidizing gas (10) can be heated while passing the packed bed.

In case the packing materials (22) are to be utilized in the fluidized bed reactor, it is required to form the packed bed in all or a part of the space enclosed by the inner wall of the reactor tube (2), the fluidizing gas supplying means (14), the reaction gas supplying means (15) and the internal heater (8a).

Preferably, the packing materials (22) used in the present invention have an average diameter ($D_f$) in the range of from 5 to 50 mm.

If the $D_f$ value is smaller than 5 mm, the number of the packing materials (22) required is too large and the space between the packing materials (22) becomes too small, making the flow of the silicon particles (3) and the fluidizing gas (10) difficult.

In contrast, if the $D_f$ value is larger than 50 mm, the number of the packing materials (22) required is too small, the space of the heating zone ($Z_h$) for the installation of the internal heater (8a) becomes insufficient and the advantage of using the packing materials (22) such as the diffusion of the fluidizing gas (10) is impaired significantly.

The packing materials (22) may be in any form selected from sphere, bead, ball, granule, fragment, lump, spheroid, polyhedron, pebble, pellet, ring, nugget, etc.

Preferably, the packing materials (22) are made of one or a plurality of components selected from the group consisting of quartz, silica, silicon nitride, boron nitride, silicon carbide, graphite, glassy carbon, silicon, and a mixture thereof in order to prevent the silicon particles (3) and the fluidizing gas (10) from being contaminated by the packing materials (22).

Most preferably, the packing materials (22) are high-purity silicon processed into a spherical form.

In case the packing materials (22) comprise such carbon-containing components as silicon carbide, graphite, glassy carbon, etc., the silicon particles (3) and the fluidizing gas (10) may be contaminated by the carbon impurities. Thus, when the packing materials (22) comprise carbon-containing substances, the surface may be coated or lined with such material as silicon, silica, quartz, silicon nitride, etc. to form a plurality of layers in the thickness direction of the packing materials (22), each layer of which is made of a different material.

Accordingly, the packing materials (22) used in the present invention may consist of a single component material or of multiple layeres in the thickness direction each layer of which is made of a different material.

If the packing materials (22) have a porous structure, they become susceptible to impact and are worn away easily to form impurity particulates. Thus, it is preferable that the packing materials (22) are in high density to minimize pores at least on the material surface.

The material, structure, surface treatment and preparation method of the packing materials (22) used in the present invention are preferably determined through the experimental verification of impurity contamination and optimum conditions using a small-scale simulation apparatus, as well as the examination of physical properties and mechanical strength.

Using the reactor heating method of the present invention, the required amount of heat can be easily supplied to the reaction zone ($Z_r$). Therefore, the productivity of the fluidized bed reactor can be significantly improved by increasing the feeding rate (mole/sec) of the reaction gas (11) per unit time under high pressure.

For silicon deposition under high pressure, in addition to the improvement of heating method, it is required to ensure the mechanical stability of the fluidized bed reactor, particularly the mechanical stability of the reactor tube (2), which is continuously exposed to the hot silicon particles in the fluidized bed.

In the present invention, as a way of enabling silicon deposition under high pressure, the fluidized bed reactor is constructed such that the reactor tube (2) is installed vertically inside the reactor shell (1), so that the reactor tube (2) is enclosed by the reactor shell (1), as illustrated schematically in FIG. 2, FIG. 3 and FIG. 4. Consequently, the inner space of the reactor tube (2) is defined as the inner zone (4), where the bed of silicon particles (3) is present and both the heating zone ($Z_h$) and the reaction zone ($Z_r$) are comprised. Further, the space in between the reactor tube (2) and the reactor shell (1) is defined as the outer zone (5), where the bed of silicon particles is not present and decomposition does not occur.

The reason why the space inside the reactor shell (1) is divided by the reactor tube (2) is because, if the pressure difference between both sides of the reactor tube (2) is small, the mechanical stability of the reactor tube (2) can be ensured even under high reaction pressure.

The internal heater (8a) installed in the heating zone ($Z_h$) may comprise one or a plurality of heater units.

Since the heat load in the heating zone ($Z_h$) required for improving the productivity of the reactor increases as the number of the heater units installed in the inner space of the heating zone ($Z_h$), or the surface of the internal heater (8a), increases, the number of the heater units to be installed in the heating zone ($Z_h$) is not particularly limited, as long as the space for their installation is allowed.

In case the internal heater (8a) comprises a plurality of heater units, the heater units may be independent of each other in electrical terms. However, it is more efficient and economical to connect them electrically in series and/or in parallel.

FIG. 1 and FIG. 2 exemplify the cases where the internal heater (8a) comprises two heater units, the heater units being connected with the power supply source (E) independently and interconnectively with the power supply source (E) in series, respectively. If the heating zone ($Z_h$) is wider, more heater units may be installed to increase the heat load.

The heater unit is electrically connected to the power supply source (E) through an electrical connection means (9, 9a, 9'), which is installed as coupled with the reactor shell (1) and allows the reactor to be heated by electrical resistance heating.

The power supply source (E) installed outside the fluidized bed reactor may be selected from one or a plurality of power converters, switch boxes, measuring and/or controlling means, etc. The current supplied to the internal heater (8a) may be either DC or AC. Normally, the current ranges from hundreds to thousand amperes.

Preferably, the electric power supplied from the power supply source to the internal heater (8a) is controlled, so that the temperature of the reaction zone ($Z_r$) and/or the heating zone ($Z_h$) is maintained within a predetermined range.

The electrical connection means (9, 9a, 9') installed as coupled with the reactor shell (1) to provide electrical connection of the internal heater (8a) with the power supply source (E) may be installed separately for each heater unit. Alternatively, it may be installed as connected with several or all the heater units.

In the present invention, the electrical connection means (9, 9a, 9'), which is installed as coupled with the reactor shell (1), is preferably not heated to high temperature during the electrical resistance heating.

Accordingly, the electrical connection means (9, 9', 9a) is recommended comprises electrodes capable of reducing spontaneous resistance heating or of cooling to below a predetermined temperature. The electrodes may be installed anywhere inside and/or outside of the reactor shell (1), as long as it can be electrically connected with the heater unit.

To perform resistance heating by supplying electricity to the heater unit, the heater unit has to be connected with a pair of electrodes. A plurality of heater units may be electrically connected with each other through the corresponding electrodes.

Accordingly, the electrical connection means (9, 9a, 9') of the present invention comprises electrodes which are installed inside and/or outside of the reactor shell (1) and the heater units can be electrically connected with each other in series and/or in parallel by the electrodes.

The electrical connection means (9, 9a, 9') may comprise part or all of the following components: (i) an electrode made of a metallic conductor having low electrical resistance and generating less heat; (ii) a connecting means that connects an electric power transferring means such as a cable, a bar, a tube, a shaft, a conduit, a shape, etc., with the electrode; (iii) a support or a chuck made of a carbon-based material which provides electric connection for the electric power transferring means and the electrodes while physically supporting the individual heater units or supports the electrodes; (iv) a cooling means for cooling the electrodes or the support with such cooling medium as gas, water, oil, etc.; (v) an insulating means for electrical insulation of the metallic materials comprising the reactor shell (1); and (vi) parts, fittings, etc., for connecting, sealing, insulating or assembling the aforementioned components.

Frequently, a resistive element (38) constituting the internal heater (8a) may be used as an electrode itself. Alternatively, other materials or sizes can be selected to reduce resistance heating.

The shape and size of the electrodes should be determined considering the diameter of the heating zone ($Z_h$) and allowed space, number and spatial arrangement of the heater units, space allowed for the electrodes or the electric power transferring means, cross-sectional area required for reducing internal resistance heating, and so forth.

The electrodes may be installed at the side and/or bottom of the reactor shell (1). Considering the structure, it is preferred that the electrodes of the internal heater (8a) are installed inside or outside of the bottom of the shell (1).

In the present invention, the electrodes provide electrical connection between the power supply source and the heater units. For each heater unit, a pair of electrodes become the input terminal and output terminal of the heater unit. The interconnection or electric circuit construction of the electrodes is determined by the spatial arrangement of the heater units and the given specification of the power supply source (E).

The electrodes may be installed as separated from each other and connected separately to the electric power transferring means. Alternatively, an electric power transferring means, or an electrode connecting means, may be equipped to electrically connect a plurality of electrodes.

FIG. 2 and FIG. 5 exemplify the case where the electrode connecting means (9') installed inside the reactor shell (1) electrically connects two heater units. As described above, the electrode connecting means (9') may be installed either in the outer space of the reactor shell (1) or as coupled with the shell (1).

The electrode connecting means may be made of the same material as the resistive element (38), which prevents severe resistance heating. Alternatively, it may be made of a metal or an alloy comprising one or a plurality of metal elements selected from copper (Cu), aluminum (Al) and cadmium (Cd) or made of graphite and coated with a functional ceramic layer of silicon carbide (SiC), etc. Here it is required to provide an insulation of the electrodes and/or the elecotrode connecting means from the metallic material of the reactor shell (1).

Since part of the electrodes may be exposed to the bottom of the hot heating zone ($Z_h$) and need electrical insulation or protection of the sealing material, it is preferred that the electrodes made of metallic material, the insulating material or all or a part of the reactor shell (1) coupled with them are cooled by a circulating cooling medium.

Like the electrode connecting means, the electrodes may be made of the same material as the resistive element (38) according to the specification that may prevent severe resistance heating. Alternatively, it may be made of a metal or an alloy comprising one or a plurality of metal elements selected from copper (Cu), aluminum (Al) and cadmium (Cd). Or, it may be made of the graphite surface-treated with silicon carbide and coated or lined for electrical insulation and/or prevention of impurity contamination.

The fluidized bed reactor may be heated only with the internal heater (8a) installed in the heating zone ($Z_h$). However, in addition to the internal heater (8a), a supplemental heater (8b) may be further installed in the outer zone (5) to supply heat to the inner zone (4).

Like the internal heater (8a), the supplemental heater (8b) may comprise one or a plurality of heater units and the heating of the reactor may be performed by electrical resistance heating using an electrical connection means (9, 9', 9a) connected with a power supply source (E) as coupled with the reactor shell (1).

In this case, the heater unit(s) of the supplemental heater (8b) may be either electrically independent of the heater unit(s) of the internal heater (8a) or electrically interconnected in series and/or in parallel. They may share the electrical connection means (9, 9', 9a) and/or the power supply source (E) or be independent of each other, as illustrated in FIG. 3 and FIG. 4.

As aforementioned, without regard to the use of the supplemental heater (8b, 8b') during the silicon deposition, the supplemental heater (8b, 8b') may be used to heat the bed of silicon particles (3) during the start-up of the reactor prior to the supply of the reaction gas (11) to the reaction zone ($Z_r$) and/or to selectively heat the silicon deposit (D), accumulated during the deposition operation on the inner wall of the reactor tube (2), prior to or during the silicon deposit removal process.

In case the supplemental heater (8b) is used to heat the bed of silicon particles (3) during the start-up of the reactor, the height of the supplemental heater (8b) is not particularly restricted, as illustrated in FIG. 3.

However, in case a supplemental heater (8b) having a heat load not exceeding that of the internal heater (8a) is used during the silicon deposition as the reaction gas (11) is supplied to the reaction zone ($Z_r$), it is preferred to restrict the height of the supplemental heater (8b), as illustrated in FIG. 4, so that the rate of the accumulation of the silicon deposit (D) on the inner wall of the reactor tube (2) cannot increase. More safely, the supplemental heater (8b) is installed at the level of the heating zone ($Z_h$) or lower.

As illustrated in FIG. 3 and FIG. 4, it is preferable that the supplemental heater (8b, 8b'), which is installed at the level where the formation of the silicon deposit (D) is excessive, is not operated during the silicon deposition process but only for heating the bed of silicon particles (3) during the start-up of the reactor and/or for selectively heating the silicon deposit (D) prior to or during the silicon deposit removal process.

As mentioned above, in addition to the internal heater (8a) installed in the heating zone ($Z_h$), a supplemental heater (8b) may be installed in the outer zone (5) to supply heat to the inner zone (4). But, instead of such supplementary heating, electromagnetic radiation energy may be supplied to the inner zone (4) to heat the silicon particles (3).

For a fluidized bed reactor with a large-diameter reactor tube (2), microwave is the most effective mode among various modes of the electromagnetic radiation energy.

In the present invention, a waveguide (36) which transmits the microwave (37) generated by a microwave generator (35) from electrical energy or the microwave generators (35) may be installed as coupled with the reactor shell (1) to supply the microwave (37) to the inner zone (4) for heating the silicon particles (3).

When a microwave generator such as magnetron is installed as coupled with the reactor shell (1) (see 35b of FIG. 5) and electric power is supplied form the power supply source (E), microwave (37) can be directly radiated into the shell (1) and no waveguide (36) is required. But, there are such problems that many generators are required because each generator has a restricted capacity and mechanical stability is not good. When the microwave generator (35) is installed outside of the reactor as connected with the reactor shell (1) by a waveguide (36), a required capacity can be attained with good reliability, but it becomes very costly.

The microwave (37) can be supplied from the top of the inner zone (4), or the reactor shell cover at which the gas discharging means (17), etc., are installed (1b of FIG. 2 or 1d of FIG. 3 and FIG. 4), to the bottom of the reaction zone ($Z_r$). In case the reactor tube (2) is made of quartz, silicon nitride, etc., which is permeable to microwave, the microwave (37) can be supplied to the heating zone ($Z_h$) through the microwave-transparent wall of the reactor tube (2).

The microwave heating may be utilized, regardless of the installation or utilization of the supplemental heater (8b) at the outer zone (5), to heat the bed of silicon particles (3) during the start-up of the reactor or to selectively heat the silicon deposit (D), accumulated during the deposition operation on the inner wall of the reactor tube (2), prior to or during the silicon deposit removal process.

In the present invention, the fluidizing gas supplying means (14) and the reaction gas supplying means (15) used to supply the fluidizing gas (10) and the reaction gas (11) into the bed of silicon particles (3), respectively, may comprise the components selected from a tube, a nozzle, a grid, a disc or a conical plate, a chamber, a flange, a fitting, a liner, a shaped article, a gasket, etc.

The fluidizing gas (10) used in the present invention plays an important role in supplying heat from the heating zone ($Z_h$) to the reaction zone ($Z_r$).

The fluidizing gas supplying means (14) installed at the bottom of the heating zone ($Z_h$) may comprise a gas distribution plate in the form of a grid, a disc or a conical plate or a gas distribution assembly having a plurality of holes for substantially uniform distribution of the fluidizing gas (10) at the bottom of the heating zone ($Z_h$) and/or comprise a plurality of fluidizing gas supplying nozzles, without restrictions in shape or structure.

The placement of the reaction gas outlet of the reaction gas supplying means (15) above the level of the fluidizing gas outlet of the fluidizing gas supplying means (14) according to the present invention gives the advantage, in addition to the heating of the reactor by the heating zone ($Z_h$), of preventing the silicon deposition problem on the surface of the fluidizing gas supplying means (14), which is exposed to the heating zone ($Z_h$).

The fluidizing gas (10) required for the silicon deposition may be supplied in a variety of ways depending on the construction of the fluidizing gas supplying means (14).

FIG. 1 exemplifies the construction of the fluidizing gas supplying means (14) where the fluidizing gas (10) is supplied by a multiple nozzle-type gas distributing means (19) into the heating zone ($Z_h$), without using a gas distribution plate. It is preferable that the multiple nozzle-type fluidizing gas distributing means (19) be well arranged, so that the flow of the fluidizing gas (10) can be substantially uniformly distributed across the cross-section of the reactor tube (2).

FIG. 2 and FIG. 3 exemplify the construction of the fluidizing gas supplying means (14), where the fluidizing gas (10) supplied to the fluidizing gas chamber (19') is provided to the heating zone ($Z_h$), while being uniformly distributed through a circular plate-type gas distributing means (19).

The fluidizing gas chamber (19') may be coupled with the reactor shell (1) and, if required, may be so constructed that the inside of the fluidizing gas chamber (19') can be heated to preheat the fluidizing gas (10).

As illustrated in FIG. 2 and FIG. 4, it is also possible to form a fixed bed of the packing materials (22) in the heating zone ($Z_h$) and make the fluidizing gas (10) flow through the space formed in between the packing materials, with the effect of additional gas distribution being achieved thereby.

When the fixed bed of the packing materials (22), that are not fluidized by the uprising flow of the fluidizing gas (10), is formed on the fluidizing gas supplying means (14) according to the present invention, the fixed bed is preferably formed below the reaction gas outlet of the reaction gas supplying means (15), that is, at the whole or a lower part of the heating zone ($Z_h$).

The reaction gas supplying means (15) which supplies the reaction gas (11) required for the silicon deposition into the reaction zone ($Z_r$) may be constructed in various forms. As illustrated in FIG. 2, it may comprise a single reaction gas nozzle or a plurality of reaction gas nozzles. Alternatively, it may constructed as coaxial multitube in which each reaction gas nozzle for supplying the reaction gas (11) is enclosed by one or a plurality of nozzles in the heating zone ($Z_h$).

When the particle discharging means (16) of the present invention is coupled with the fluidizing gas supplying means (14) at the bottom of the reactor shell (1), the particle discharging means (16) may be installed and assembled in the form of a coaxial multitube along with the reaction gas supplying means (15). Otherwise the particle discharging means (16) may be constructed in an independent form separately from the reaction gas supplying means.

Depending on the volume of the heating zone ($Z_h$), there may be one or a plurality of coaxial multitubes. Examples of the construction of the reaction gas supplying means (15) in relation to the fluidizing gas supplying means (14) and the particle discharging means (16) are given hereinbelow.

FIG. 2 illustrates a single set of multitubes as one example of the construction of the reaction gas supplying means (15) as coaxial multitube in the heating zone ($Z_h$). As illustrated in the figure, a tube-type reaction gas nozzle and a tube-type protection nozzle for protecting it may be formed as double-tube and the bottom of the double-tube may be assembled with the particle discharging means (16) as coaxially as possible.

Preferably, the reaction gas supplying means (15) is constructed such that an inert gas (12) comprising one or a plurality of components selected from hydrogen, nitrogen, argon and helium may be introduced through the annular space between the reaction gas nozzle and the protection nozzle. This prevents the inner wall of the reaction gas nozzle from being heated up to the temperature at which silicon deposition is possible, thereby apparent silicon deposition and its accumulation on the inner wall of the reaction gas nozzle being prevented.

Further, the reaction gas supplying means (15) may comprise a means capable of continuously, intermittently or periodically adding hydrogen chloride to the inert gas (12) in order to prevent silicon from being deposited and accumulated at the outlet of the reaction gas nozzle or to remove the already-formed silicon deposit.

In case it is difficult to maintain the temperature of the inner wall of the reaction gas nozzle below the incipient decomposition temperature, at which silicon deposition begins, by installing only one protection nozzle for surrounding the reaction gas nozzle, two or more protection nozzles may be installed in the form of a coaxial multitube.

No matter what the construction may be, the particle discharging means (16) according to the present invention is preferably constructed such that an inert gas (12) comprising one or a plurality of components selected from hydrogen, nitrogen, argon and helium can be introduced along the opposite direction of the flow of the silicon product particles (3b) inside the particle discharging means (16). The gas may be introduced into the heating zone ($Z_h$) after passing through the particle discharging means (16).

Alternatively, as illustrated schematically in FIG. 3, a reaction gas nozzle may be installed vertically at the center of the fluidizing gas supplying means (14) which makes the fluidizing gas (10) supplied to the fluidizing gas chamber (14') provided to the heating zone ($Z_h$) after being uniformly distributed by a gas distributing means (19), the lower part of the nozzle forming a coaxial double-tube with the particle discharging means (16), so that the product particles (3b) can move downward from the heating zone ($Z_h$) at the center.

Further, as illustrated schematically in FIG. 4, the reaction gas nozzle and the protection nozzle form a coaxial double-tube in the heating zone ($Z_h$) and, below that, it forms a coaxial multitube along with an assembly-type fluidizing gas supplying means (14) comprising the gas distributing means (19).

The particle discharging means (16) may be equipped as coupled with a gas distributing means (19) comprised in the fluidizing gas supplying means (14), separately from the reaction gas supplying means (15).

The particle discharging means (16) installed in the fluidized bed reactor of the present invention is used to discharge from the inner zone (4) of the reactor part of the polysilicon product particles (3b) prepared continuously or semi-continuously or other silicon particles produced otherwise during the silicon deposition process.

The particle discharging means (16) enables the silicon particles (3b) to be discharged from the inner zone (4) continuously, periodically or intermittently, at the right time.

Further, an additional space can be equipped at the reactor shell (1), so that, as illustrated in FIG. 3, the silicon particles (3b) may be cooled while remaining in the fluidizing gas chamber (14') and then discharged out of the reactor.

According to the present invention, part of the silicon particles (3) discharged from the inner zone (4), i.e., the silicon product particles (3b), may be transferred to a polysilicon product storing means or transporting means which is directly connected with the reactor.

Since the silicon product particles (3b) prepared using the fluidized bed reactor inevitably has a particle size distribution, the small-sized particles included therein may be utilized as seed crystals (3a).

Accordingly, it is possible to transfer the silicon product particles (3b) discharged from the inner zone (4) to a classifying means, classify them according to size, transfer the large-sized particles to the polysilicon product storing means or transporting means and utilize the small-sized particles as seed crystals (3a).

Considering the hot temperature of the reactor inner zone (4), or the bed of silicon particles, it is preferable that the silicon product particles (3b) are cooled while passing through the particle discharging means (16). Thus, a gas such as hydrogen, nitrogen, argon, helium, etc., may be introduced through the particle discharging means (16) or a cooling medium such as water, an oil, a gas, etc., may be circulated along the wall of the particle discharging means (16) to cool down the hot particles.

In addition, although not illustrated in the figure, the particle discharging means (16) may be constructed with sufficient space, for example, by coupling to the fluidizing gas chamber (14') of FIG. 3 or to the bottom of the reactor shell (1b of FIG. 3), so that the silicon product particles (3b) can be cooled while remaining in the fluidized bed reactor before being discharged out of the fluidized bed reactor.

While the silicon product particles (3b) are discharged out of the reactor passing through the particle discharging means (16), it is required to prevent impurity contamination of them. Thus, it is preferable to use a tube, a liner or a shaped article made of an inorganic material in the components of the particle discharging means (16) that contact the hot silicon product particles (3b).

Such components of the particle discharging means (16) need to be coupled and fixed to the reactor shell (1) and/or liner, etc. made of metallic material. The inner wall of the components of the particle discharging means (16) that contact fairly cooled product particles or whose walls can be cooled can be equipped with, instead of the inorganic material, a tube, a liner or a shaped article made of metallic material, which is coated or lined with a polymeric material without including an additive or a filler.

As aforementioned, the silicon product particles (3b) may be discharged continuously, periodically or intermittently from the reactor inner zone (4) through the particle discharging means (16) by the polysilicon product storing means or transporting means.

Also, it is possible to install a classifying means between the reactor and the product storing means to classify the silicon product particles (3b) based on size and utilize the small-sized particles as seed crystals (3a).

Various particle-classifying apparatuses utilized in the industry can be used as the classifying means in the present invention. Preferably, the components of the classifying means which contact the silicon product particles (3b) are made of the material used in the particle discharging means (16) or a polymeric material not including an additive or a filler, in order to prevent impurity contamination during the particle classification.

Although FIGS. 2 to 4 schematically exemplify the simplest case where one set of coaxial multitube is installed vertically, this scheme can also be utilized when a plurality of coaxial multitubes are to be installed in the inner space of the heating zone ($Z_h$) to construct the reaction gas supplying means (15) consisting of a plurality of the reaction gas tubes.

The components of the above-described fluidizing gas supplying means (14), reaction gas supplying means (15) and/or particle discharging means (16) may be made of, in addition to the metal that can be used in the reactor shell (1), one or a plurality of substances selected from quartz, silica, silicon nitride, boron nitride, silicon carbide, graphite, silicon and glassy carbon.

Particularly, the components that contact the silicon particles (3) and/or the product particles (3b) may consist of a single component material, i.e., a single layer or of a plurality layers made of silicon, silicon nitride, or quartz, etc., in the thickness direction, in order to prevent impurity contamination of the silicon particles (3).

As described above, when the inner space of the reactor shell (1) is respectively defined as the inner zone (4) and the outer zone (5) by the reactor tube (2) according to the present invention, it is possible to reduce the pressure difference between both sides of the reactor tube (2) through manipulation and to sufficiently increase the reaction pressure without impairing the stability of the reactor tube (2).

To attain this purpose, it is required that the fluidized bed reactor comprises (i) an inert gas connecting means (26) for maintaining the outer zone (5) under an inert gas atmosphere; (ii) a pressure controlling means for measuring and/or controlling the inner zone pressure ($P_i$) and/or the outer zone pressure ($P_o$); and (iii) a pressure-difference controlling means for maintaining the pressure difference within the range of $0 \text{ bar} \leq |P_o - P_i| \leq 1 \text{ bar}$.

In the inner zone (4) of the fluidized bed reactor, a bed of silicon particles (4a) is formed and the fluidizing gas (10) and the reaction gas (11) is supplied to the bed of silicon particles (4a) through the fluidizing gas outlet and the reaction gas outlet, respectively, resulting in silicon deposition. The inner zone (4) of the fluidized bed reactor has a space for the flow of the off-gas (13), which comprises the fluidizing gas (10), the unreacted reaction gas (11) and the reaction byproduct gas.

Therefore, the inner zone (4) plays a basic role in the preparation of polysilicon particles through silicon deposition in the fluidized bed of the silicon particles (3).

In contrast, the bed of silicon particles (3) is not formed in the outer zone (5) and the reaction gas (11) does not flow there. Accordingly, silicon deposition does not occur in the outer zone (5), which is formed in between the outer wall of the reactor tube (2) and the reactor shell (1).

The outer zone (5) plays the following important roles.

First, the outer zone (5) provides a space for protecting the reactor tube (2) by maintaining the pressure difference between the inner zone (4) and outer zone (5) within a limited range.

Second, the outer zone (5) provides a space for the insulation material (6) which prevents or reduces heat loss from the reactor.

Third, the outer zone (5) provides a space for the supplemental heater (8b) to be installed along the circumference of the reactor tube (2), in addition to the internal heater (8a) installed in the inner zone (4).

Fourth, the outer zone (5) prevents organic or inorganic gaseous or solid impurities that can induce explosion or corrosion inside the inner zone (4) from being migrating in by maintaining the outside of the reactor tube (2) under an inert gas atmosphere and provides a space for safely installing and maintaining the reactor tube (2) inside the reactor shell (1).

Fifth, the outer zone (5) enables the measurement of the gas composition, concentration, temperature, pressure, particle composition, etc., which are specific to the inner zone (4), through an outer zone connecting means (28), thereby enabling the real-time monitoring of any occurrence of problems at the reactor tube (2).

Sixth, the outer zone (5) provides a space in which the heater (8b') for heating the silicon deposit, which is accumulated on the inner wall of the reactor tube (2) as illustrated in FIG. 4 and is required to be chemically removed according to the silicon deposit removal process.

Seventh, the outer zone (5) makes it easy to assemble and disassemble the reactor tube (2) and the inner zone (4).

Because the outer zone (5) of the present invention has various functions, the space of the outer zone can be divided up and down and/or circumferentially using at least one partitioning elements such as tube, plate, shaped article, fitting, etc.

However, when the outer zone (5) is divided, it is preferable that the divided spaces are interconnected to ensure the same gas atmosphere and pressure.

In the outer zone (5), an insulating material may be equipped outside of the reactor tube (2). For the insulation material (6), an inorganic material insulating material frequently used in the industry for the purpose of inhibiting the heat transfer by radiation and conduction in the form of a cylinder, a block, a fabric, a blanket, a felt, a foam, a packed bed, etc., may be used.

In the present invention, an inert gas connecting means (26a, 26b) is equipped at the reactor shell (1) in order to maintain the outer zone (5) under an inert gas atmosphere, without regard to the silicon deposition occurring in the inner zone (4).

The inert gas (12) may be at least one selected from hydrogen, nitrogen, argon and helium.

The inert gas connecting means (26a, 26b) which is installed at the reactor shell (1) and spatially connected with the outer zone (5) enables supply or discharge of the inert gas (12) and may be equipped with one or a plurality of components selected from a tube, a nozzle, a flange, a valve, a fitting, etc.

It is also possible to install an outer zone connecting means (28) at the reactor shell (1), in addition to the inert gas connecting means (26a, 26b), which is spatially exposed to the outer zone (5) directly or indirectly for measurement and control of temperature, pressure and gas components.

One inert gas connecting means (26a, 26b) may be sufficient to maintain the outer zone (5) under an inert gas atmosphere. Alternatively, two or more inert gas connecting means (26a, 26b) may be used to perform the supply and discharge of the inert gas independently.

In addition to the independent maintenance of an inert gas atmosphere in the outer zone (5), the inert gas connecting means (26a, 26b) may be utilized for the measurement and control of flow rate, temperature, pressure and gas components, which can be preformed using the outer zone connecting means (28).

FIG. 3 and FIG. 4 exemplify various cases where the outer zone pressure (Po) is measured and/or controlled using the inert gas connecting means (26a, 26b) and/or the outer zone connecting means (28).

The outer zone connecting means (28), which can be installed separately from the inert gas connecting means (26a, 26b), is installed to measure and control the status of the outer zone (5).

The outer zone connecting means (28) may also be equipped with one or a plurality of components selected from a tube, a nozzle, a flange, a valve, a fitting, etc.

In the absence of the inert gas connecting means (26a, 26b), the outer zone connecting means (28) may be utilized for the supply and discharge of the inert gas (12), as well as for the measurement and control of temperature, pressure and gas component.

Therefore, the inert gas connecting means (26a, 26b) and the outer zone connecting means (28) need not be always distinguished in type or function.

Unlike the outer zone (5), the pressure of which can be maintained almost constantly with position and time, there inevitably occurs a pressure difference in the inner zone (4) because the bed of silicon particles (3) exists there. That is, the inner zone pressure (Pi) differs depending on the positions of the inner zone (4).

The pressure drop imposed by the fluidized bed of solid particles depends on the height of the fluidized bed, but unless the height of the fluidized bed is exceptionally high, the value of the pressure drop is usually about 0.5-1 bar or less. Further, pressure fluctuates irregularly with time according to the fundamental characteristics of the fluidized bed of solid particles. Accordingly, the inner zone pressure (Pi) can be varied depending on the position and time.

Considering the above, an inner pressure controlling means for measuring or controlling the inner zone pressure (Pi) is directly or indirectly installed at an adequate location and spatially connected with the inner zone (4).

The inner pressure controlling means and/or the outer pressure controlling means of the present invention can be installed at various positions, considering the reactor characteristics and the operation variables to be controlled.

The inner pressure controlling means can be installed as spatially connected with the inner zone (4) through an inner zone connecting means (24, 25), the fluidizing gas supplying means (14), the reaction gas supplying means (15), the particle discharging means (16) or the gas discharging means (17) spatially exposed to the inner zone (4) directly or indirectly.

The outer pressure controlling means is installed as spatially connected with the outer zone (5) through the outer zone connecting means (28) installed at the reactor shell (1) or the inert gas connecting means (26a, 26b), which are spatially exposed to the outer zone (5) directly or indirectly.

In a preferred embodiment of the present invention, the inner pressure controlling means and/or the outer pressure controlling means comprise the components required to measure and/or control pressure directly or indirectly.

The inner pressure controlling means and/or the outer pressure controlling means may comprise at least one components selected from: a connection tube or a fitting required for spatial connection; manual, semi-automatic or automatic valves; a digital or an analog pressure gauge or a differential pressure gauge; a pressure indicator or a recorder; a signal converter or a programmable controller, etc.

The inner pressure controlling means and/or the outer pressure controlling means may be connected with each other mechanically or in terms of signal circuit. Also, they may be connected in part or as a whole with such a control means as central control system, distributed control system and local control system.

The inner pressure controlling means and/or the outer pressure controlling means may be constructed independently in terms of pressure, but they may be connected in part or as a whole with a means required for measuring and/or controlling of flow rate, temperature, gas component, particle concentration, etc., as well as pressure.

Further, in order to prevent the components of the inner pressure controlling means and/or the outer pressure controlling means from impurity contamination, solid particles, etc. or to damp pressure change, the control means can be equipped with a partitioning means such as particle separation filter, scrubber, etc. or a pressure damping pot.

The inner pressure controlling means may be installed at the part of the reactor shell (1) which is spatially exposed to the inner zone (4) directly or indirectly, for example, at the inner zone connecting means (24, 25) installed for the measurement and/or monitoring of pressure, temperature or gas components.

When the inner pressure controlling means is installed as connected with the inner zone connecting means (24, 25), the pressure of the upper space of the inner zone (4c) can be stably measured and controlled although it is difficult to check the change of pressure with time caused by the fluidized bed of silicon particles.

To check the change of pressure with time caused by the fluidized bed, the inner zone connecting means may be installed as spatially connected with the bed of silicon particles.

Besides, the inner pressure controlling means may be installed at the location where it can be spatially connected with the inner zone (4) as connected with the reactor shell (1), for example, at the location connected with the fluidizing gas supplying means (14), the reaction gas supplying means (15), the particle discharging means (16) or the gas discharging means (17).

Further, the inner pressure controlling means can be installed at more than two locations that can be spatially connected with the inner zone connecting means (24, 25) and the inner zone (4).

Depending on the location where the inner pressure controlling means is installed, the $P_i$ value measured due to the presence of the silicon particles becomes different. According to the experiments performed by the present inventors, the $P_i$ value varied within 1 bar at different locations, although dependent on the fluidization characteristics of the fluidized bed and the structure of the fluidizing gas supplying means (14), the reaction gas supplying means (15), the particle discharging means (16) or the gas discharging means (17).

In a preferred embodiment of the present invention, the outer pressure controlling means is located at the position selected from several ones suitable for measuring and/or controlling the outer zone pressure ($P_o$) directly or indirectly, and installed there as spatially connected with the outer zone (5).

Examples of the position where the outer pressure controlling means can be installed include the outer zone connecting means (28) or the inert gas connecting means (26a, 26b) which are installed at the reactor shell (1) as spatially exposed to the outer zone (5) directly or indirectly.

In the present invention, the outer zone (5) is preferably maintained under an inert gas atmosphere. Thus, it is possible to utilize the inert gas connecting means (26a) for supplying the inert gas (12) into the outer zone (5) and the inert gas connecting means (26b) for discharging the inert gas (12) from the outer zone (5) as the outer zone connecting means (28).

Accordingly, it is also possible to spatially connect the outer pressure controlling means for measuring and/or controlling the outer zone pressure ($P_o$) directly or indirectly with the outer zone (5) through the inert gas connecting means (26a, 26b) or the outer zone connecting means (28).

In the present invention, the inner pressure controlling means and/or the outer pressure controlling means may be utilized to maintain the difference of the inner zone pressure ($P_i$) and the outer zone pressure ($P_o$), that is, the $|P_o-P_i|$ value, in the range of from 0 to 1 bar.

But, when constructing the inner pressure controlling means, it should be kept in mind that the $P_i$ value varies at different positions in the inner zone (4).

The $P_i$ value measured at the inner zone connecting means, the fluidizing gas supplying means (14), the reaction gas supplying means (15), the particle discharging means (16), etc., which are installed at positions spatially connected with the inside or bottom of the fluidized bed, is larger than the $P_i$ value measured at the inner zone connecting means, the gas discharging means (17), the silicon seed crystals supplying means (18), etc., which do not directly contact the fluidized bed of silicon particles.

Particularly, the pressure determined at the inner zone connecting means, the fluidizing gas supplying means (14) or the particle discharging means (16) which are spatially connected with the bottom of the fluidized bed of silicon particles may be the maximum inner pressure $P_i$(max) and the pressure determined at the gas discharging means (17) or the inner zone connecting means (24, 25) which do not contact the fluidized bed may be the minimum inner pressure $P_i$(min).

It is because there inevitably occurs pressure difference in the bed of silicon particles (3) depending upon the height and the $P_i$ value at the bottom of the bed is always higher than the $P_i$ value at the top of the bed of silicon particles.

The pressure difference increases with the height of the bed of silicon particles. To attain a pressure difference in the bed of silicon particles larger than 1 bar, the height of the reactor has to be increased excessively. In contrast, if the pressure difference between the top and the bottom of bed of silicon particles are less than 0.01 bar, the height of the bed of silicon particles becomes too small, resulting in less productivity.

Accordingly, the pressure difference due to the height of the bed of silicon particles is preferably maintained within the range of from 0.01 to 1 bar.

In other words, the difference of the maximum pressure value $P_i$(max) and the minimum pressure value $P_i$(min) is preferably maintained within the range of from 0 to 1 bar.

In maintaining the pressure difference between both sides of the reactor tube (2), or the $|P_o-P_i|$ value, within the range of from 0 to 1 bar according to the present invention, it should be kept in mind that the pressure difference differs at different height of the reactor tube (2).

When the inner pressure controlling means is spatially connected with the inner zone (4) through the inner zone connecting means, the fluidizing gas supplying means (14), the reaction gas supplying means (15) or the particle discharging means (16), which are spatially connected to the inside or bottom of the bed of silicon particles having a higher pressure than the top of the inner zone (4c), it is preferable that the condition $P_o \leq P_i$ and 0 bar$\leq (P_i-P_o) \leq$1 bar is satisfied.

In contrast, when the inner pressure controlling means is spatially connected with the inner zone (4) through the gas discharging means (17), the silicon seed crystals supplying means (18) or the inner zone connecting means (24, 25), which do not contact the fluidized bed of silicon particles and are spatially connected to the top space of the inner zone (4c) having a lower pressure than the inside or bottom of the bed of silicon particles, it is preferable that the condition $P_i \leq P_o$ and 0 bar$\leq (P_o-P_i) \leq$1 bar is satisfied.

Further, the average of the pressure values measured more than one location can be utilized in constructing the inner pressure controlling means and the outer pressure controlling means.

Especially, since the inner zone pressure ($P_i$) may vary depending on to which space it is connected, the inner pressure controlling means may comprise a controller capable of measuring the pressure values with more than one pressure gauge and compute the average value.

Therefore, in maintaining the pressure difference between both sides of the reactor tube (2), or the $|P_o-P_i|$ value, within the range of from 0 to 1 bar according to the present invention, it is more preferable that the outer zone pressure (Po) is maintained between the maximum pressure $P_i$ (max) and the minimum pressure $P_i$ (min).

It is required that the inner pressure controlling means and/or the outer pressure controlling means according to the present invention comprise a pressure-difference controlling means which maintains the $|P_o-P_i|$ value within the range of from 0 to 1 bar, i.e., 0 bar$\leq |P_o-P_i| \leq$1 bar.

The pressure-difference controlling means may be comprised in either the inner pressure controlling means or the outer pressure controlling means, or both.

However, considering that the $P_i$ value can be varied at different positions in the inner zone (4), it is preferred that, in the inner zone (4), the $P_i$ value inside of the bed of silicon particles having higher pressure than the top of the inner zone (4c), such as the fluidizing gas supplying means (14), the reaction gas supplying means (15), the particle discharging means (16), the inner zone connecting means, etc., particularly, the bottom of the bed of silicon particles with the highest pressure, is regulated by the pressure-difference controlling means to satisfy the condition $P_o \leq P_i$ and 0 bar$\leq (P_i-P_o) \leq$1 bar.

The inner pressure controlling means may be spatially connected with the inside of the bed of silicon particles through the fluidizing gas supplying means (14), the reaction gas supplying means (15), the particle discharging means (16) or the inner zone connecting means, so that the pressure-difference controlling means can maintain the difference of the outer zone pressure ($P_o$) and the inner zone pressure ($P_i$) within 0 bar$\leq (P_i-P_o) \leq$1 bar.

In contrast, in the inner zone (4), the $P_i$ value of the location spatially connected to the top of the inner zone (4c) is preferably regulated by the pressure-difference controlling means to satisfy the condition $P_i \leq P_o$ and 0 bar$\leq (P_o-P_i) \leq$1 bar.

Since the inner pressure controlling means is spatially connected with the inner zone (4) through the gas discharging means (17), the silicon seed crystals supplying means (18), the inner zone connecting means (24, 25), etc., which do not contact the fluidized bed of silicon particles, the pressure-difference controlling means can maintain the difference of the outer zone pressure ($P_o$) and the inner zone pressure ($P_i$) within 0 bar$\leq (P_o-P_i) \leq$1 bar.

In the present invention, the pressure-difference controlling means may be comprised in either the inner pressure controlling means or the outer pressure controlling means, or both and may be interconnected to maintain the $|P_o-P_i|$ value within the range of from 0 to 1 bar.

As long as the difference of the outer zone pressure (Po) and the inner zone pressure (Pi) is maintained within the range of from 0 to 1 bar using the pressure-difference controlling means according to the present invention, the value of either $P_i$ or $P_o$ may be very large or very small.

In view of productivity, it is preferable that the reaction pressure is at least 1 bar absolute.

The feeding rate of the fluidizing gas (10) and the reaction gas (11) based on the moles or mass per unit time increases almost in proportion to the pressure.

Accordingly, as the reaction pressure, or the $P_o$ or $P_i$ value, increases, heating of the gases in the bed of silicon particles to the reaction temperature becomes a difficult task.

However, it is difficult to preheat the reaction gas (11) to the incipient decomposition temperature of about 300-350° C. prior to supplying it to the reactor. Further, preheating of the fluidizing gas (10) to the reaction temperature or above outside the fluidized bed reactor is risky because of the possibility of impurity contamination. Further, since it is practically difficult to apply a perfect insulation to the fluidizing gas supplying means (14), preheating is limited to a temperature lower than the reaction temperature.

Further, if the reaction pressure exceeds about 20 bar, it is practically impossible to supply the heat required to maintain the reaction temperature even the internal heater (8a) is installed in the heating zone ($Z_h$) to the full heat load.

Considering these restrictions, it is preferable that the outer zone pressure (Po) or the inner zone pressure (Pi) ranges about from 1 to 20 bar absolute.

According to the present invention, the inner pressure controlling means and the outer pressure controlling means may comprise a pressure-difference controlling means which reduces the pressure difference between both sides of the reactor tube (2) as described below.

Using the pressure-difference controlling means, it is possible to increase the reaction pressure without impairing the stability of the reactor tube (2), thereby improving the productivity and ensuring the stability of the fluidized bed reactor.

For example, the inner pressure controlling means and the outer pressure controlling means may comprise each pressure-difference controlling means, respectively, so that the inner pressure of the inner zone (Pi) and the outer pressure of the outer zone (Po) can be controlled as $P_i^*$ and $P_o^*$, which are control reference values satisfying the condition 0 bar$\leq |P_o^*-P_i^*| \leq$1 bar, respectively, no matter what position of the inner zone (4) the inner pressure controlling means may be connected.

For this purpose, the inner pressure controlling means may comprise a pressure-difference controlling means for maintaining the predetermined inner pressure value $P_i^*$ and the outer pressure controlling means may comprise a pressure-difference controlling means for maintaining the outer pressure value $P_o^*$, which satisfies the condition that the pressure difference between both sides of the reactor tube (2) is maintained within 0 bar≤|P$_o$*−P$_i$*|≤1 bar.

Similarly, the outer pressure controlling means may comprise a pressure-difference controlling means for maintaining the predetermined outer pressure value P$_o$* and the inner pressure controlling means may comprise a pressure-difference controlling means for maintaining the inner pressure value P$_i$*, which satisfies the condition that the pressure difference between both sides of the reactor tube (2) is maintained within 0 bar≤|P$_o$*−P$_i$*|≤1 bar.

Alternatively, a pressure-difference controlling means may be comprised so that the inner pressure controlling means can maintain the predetermined inner pressure value P$_i$* no matter where it is connected with the inner zone (4). The outer pressure controlling means may comprise a pressure-difference controlling means for controlling the outer pressure (P$_o$) to satisfy the condition 0 bar≤|P$_o$−P$_i$*|≤1 bar, without regard to the height.

When setting the P$_i$* and P$_o$* values of the pressure-difference controlling means to maintain the difference of the outer zone pressure (P$_o$) and the inner zone pressure (P$_i$) within the range of from 0 to 1 bar, it is necessary to consider the flow of impurities through the sealing means (41a, 41b) of the reactor tube (2).

In installing and operating the fluidized bed reactor of the present invention, it is not easy to attain perfect gas sealing using the sealing means (41a, 41b) of the reactor tube (2). Besides, due to the intrinsic thermal expansion of the reactor tube (2) or the shear stress imposed on the reactor tube (2) caused by the fluidization of the silicon particles (3), the sealing provided by the sealing means (41a, 41b) may become insufficient.

According to the present invention, through right setup of the operating condition of the pressure-difference controlling means, or the P$_i$* and P$_o$* values, the problem of the flow of the impurities between the inner zone (4) and the outer zone (5) through the sealing means (41a, 41b) can be solved.

According to the present invention, in order to control the inner zone pressure and the outer zone pressure, the pressure control condition of the pressure-difference controlling means can be determined based on the analysis of the composition of the off-gas (13) or the gas present in the outer zone (5).

For example, through the composition analysis of the off-gas (13) using the gas discharging means (17) or the off-gas treating means (34) or the composition analysis of the gas present in the outer zone using the outer zone connecting means (28) or the inert gas connecting means (26b), the movement of impurities through the sealing means (41a, 41b) between the inner zone (4) and the outer zone (5) can be monitored.

If the component of inert gas (12) not supplied to the inner zone (4) is detected in the off-gas (13), the P$_o$* value can be decreased or the P$_i$* value can be increased to reduce or prevent the flow of impurities from the outer zone (5) to the inner zone (4).

In contrast, if the component included in the off-gas (13) in the inner zone (4) is detected in the gas discharged out of the outer zone (5), in addition to the component included in the inert gas (12), the P$_o$* value can be increased or the P$_i$* value can be decreased to reduce or prevent the flow of impurities from the inner zone (4) to the outer zone (5).

In this manner, through adequate selection of the control conditions of the pressure controlling means, it is possible to reduce or prevent the flow of impurities between the two zones, even when the sealing means (41a, 41b) of the reactor tube (2) does not provide perfect sealing during the installation and operation of the fluidized bed reactor.

But, no matter how the P$_i$* value and the P$_o$* value are set up at the pressure-difference controlling means, the condition 0 bar≤|P$_o$*−P$_i$*|≤1 bar should be satisfied.

As another example for attaining the purpose of the present invention, the inner pressure controlling means and the outer pressure controlling means may be connected with each other, so that the difference of the inner pressure and the outer pressure, ΔP=|P$_o$−P$_i$|, can be measured and the inner pressure controlling means and/or the outer pressure controlling means may be regulated manually, semi-automatically or automatically by the pressure-difference controlling means of the present invention, so that the ΔP value can be maintained within the range of from 0 to 1 bar for the pressure P$_i$ at any position in the inner zone (4).

As another example for attaining the purpose of the present invention, the pressure-difference controlling means of the present invention may comprise an equalizing line which spatially interconnects a connection tube comprised in the inner pressure controlling means and a connection tube comprised in the outer pressure controlling means.

The connection tube which is comprised in the inner pressure controlling means and constituting the equalizing line may be installed at the position that can be spatially connected with the inner zone (4) directly or indirectly, including the inner zone connecting means (24, 25) which is spatially exposed to the inner zone (4) directly or indirectly, the fluidizing gas supplying means (14,14'), the reaction gas supplying means (15), the particle discharging means (16), the gas discharging means (17) and the seed crystals supplying means (18).

Further, the connection tube which is comprised in the outer pressure controlling means and constituting the equalizing line may be installed at the position that can be spatially connected with the outer zone (5) directly or indirectly, including the outer zone connecting means (28) which is installed at the reactor shell (1) spatially exposed to the outer zone (5) directly or indirectly and the inert gas connecting means (26a, 26b).

The equalizing line which spatially interconnects the inner pressure controlling means and the outer pressure controlling means can be seen as the simplest type of pressure-difference controlling means because the pressure difference between the two zones (4, 5) is maintained mostly near 0 bar.

Despite such advantage, if the pressure-difference controlling means is constructed with the equalizing line only, gas components and impurities may be intermixed between the two zones (4, 5).

If so, the impurities discharged from the insulating material in the outer zone (5) and the supplemental heater may contaminate the inner zone (4), particularly the polysilicon particles. Also, the silicon particles, unreacted reaction gas or reaction byproducts from the inner zone (4) may contaminate the outer zone (5).

Therefore, when the equalizing line is utilized as the pressure-difference controlling means, a pressure equalizing means may be equipped at the equalizing line in order to reduce or prevent the intermixing of gas components and impurities between the two zones (4, 5).

The pressure equalizing means may comprise one or a plurality of check valves that can prevent the intermixing of gases and impurities without affecting the pressure maintenance between the two zones (4, 5), a pressure equalizing valve, a 3-way valve, a particle separation filter, a damping container, a packed bed, a piston, a third fluid, a pressure compensation apparatus using separation membrane, etc.

Besides, the pressure-difference controlling means may further comprise a manual valve capable of regulating and controlling pressure and flow rate or a (semi)automatic valve which is controlled (semi)automatically by the predetermined pressure or pressure difference.

These valves may be installed as coupled with the connection tube, along with a pressure gauge and an indicator that displays the pressure or pressure difference value.

For commercially available pressure gauges and indicators, there are analog type, digital type and combination thereof. A system capable of data storage and control can be constructed by linking with a data processing means such as signal converter, signal processor, etc. and a local controller, a distributed controller or a central controller that provides computational capability.

In order to supply the heat needed by the reaction zone ($Z_r$), selection, design, construction, operation and control of the internal heater (8a) installed in the heating zone ($Z_h$) are important. In this regard, the electrical resistance heating technique, which is industrially accepted, can be utilized in the present invention.

To take an example, the electrical resistance heating technique mentioned in M. Orfeuil, "Electric Process Heating: Technologies/Equipments/Applications," Battelle Press, 1987 (ISBN 0-935470-26-3) and the literatures cited therein are applicable in the present invention.

In utilizing such a technique, it is necessary to consider that the internal heater (8a) used in the present invention is installed in the heating zone ($Z_h$) while contacting the bed of high-purity silicon particles (3), at least part of which remaining in the fluidized state.

The internal heater (8a) that can be used in the present invention may be in any form as long as it can endure the impact, stress and vibration of the fluidized bed accompanied by the movement of the silicon particles (3) in the reactor tube (2), which sometimes shows irregular fluidized state, explosion of gas bubbles, etc. and is electrically connected with the electrical connection means (9, 9', 9a) for resistance heating.

Accordingly, the heater unit comprising the internal heater (8a) shall include a resistive element (38) that provides the electrical resistance heating, have enough mechanical stability, so that it can be installed in the fluidized bed of particles, and be protected from impurity contamination from the silicon particles (3) and the fluidizing gas (10), which are constantly contacting the internal heater (8a) in the heating zone ($Z_h$), and the packing materials (22).

The resistive element (38), which constitutes the heater unit and provides electrical resistance heating in the present invention, may be in the form of a rod, a wire, a filament, a bar, a strip or a ribbon having circular, elliptical or polygonal cross-section in the thickness direction or a conduit, a tube, a cylinder or a duct having concentric circular, elliptical or polygonal cross-section. The cross-section may have one or a plurality of shapes and/or sizes along the length direction.

For a material of the resistive element (38), one experiencing no significant physical property change by electric current, having a melting point of at least about 100° C. or above higher than reaction temperature and having a resistivity of ranging from about 1 μohm·cm to 0.1 ohm·cm in the heating temperature range is preferable. The resistive element materials cited in the aforementioned references can be used in the present invention.

The material of the resistive element (38) may comprise one or two selected from graphite, silicon carbide and silicon.

Graphite, which is frequently used as the resistive element (38) of the electrical resistance heater, can be used in a pure or composite form after being processed to a required length, cross-section and shape. Preferably, a silicon carbide layer having a thickness of about 50-100 μm is formed on the graphite surface in order to prevent the formation of particulate impurities.

For example, a silicon carbide layer may be formed on the surface of a graphite tube having a large diameter, which has been processed to form meandering slots, to be used as the resistive element (38), like the one used for heating the silicon melt crucible in the silicon single crystal growth apparatus.

Silicon may be preferred as the resistive element (38) for the internal heater (8a) installed inside the bed of high purity silicon particles (3). But, because high purity silicon has too high specific resistance in the low temperature range, it may be doped with impurities, formed into a composite along with a resistive element (38) having low specific resistance or formed into a structure having a plurality of layers along with the components that offer good resistance heating at low temperature.

The resistive material frequently used for the electrical resistance heating may comprise metal or alloy.

The material comprising the resistive element (38) may comprise metal or alloy comprising one or a plurality of metal elements selected from tungsten (W), rhenium (Re), osmium (Os), tantalum (Ta), molybdenum (Mo), niobium (Nb), iridium (Ir), ruthenium (Ru), technetium (Tc), hafnium (Hf), rhodium (Rh), vanadium (V), chromium (Cr), zirconium (Zr), platinum (Pt), thorium (Th), lanthanum (La), titanium (Ti), lutetium (Lu), yttrium (Y), iron (Fe), nickel (Ni), magnesium (Mg) and aluminum (Al).

Further, the resistive element (38) may comprise a non-carbon-based ceramic component and a metal element along with at least one selected from the group consisting of molybdenum silicide (Mo—Si), lanthanum chromite (La—Cr—O), zirconia, and a mixture thereof.

The size of the heater unit of the internal heater (8a) is not particularly limited as long as it can avoid the contact with the reaction gas (11) as installed inside the heating zone ($Z_h$), endure the impact, stress and vibration caused by the fluidization of the silicon particles (3) and offer resistance heating as electrically connected with the electrical connection means (9, 9', 9a).

However, because the capacity of the individual internal heater unit is determined not only by the particular material but also by such electric properties as the electric resistance directly affected by the cross-sectional area through which electric current flows, it is preferable to optimize the resistance heating characteristics.

The resistive element (38) constituting the heater unit is electrically connected with the power supply source (E) through the electrical connection means (9, 9', 9a) comprising the electrodes.

As described earlier, since most of the components constituting the resistive element (38) are impurities that contaminate the high purity silicon particles (3), it is important to prevent its direct contact with the silicon particles (3).

Hence, in order to prevent direct contact of the resistive element (38) with the silicon particles (3), (i) a protection tube (40) may be equipped at the outside of the resistive element (38); (ii) one or a plurality of separation layers (39), each made of a different barrier component, may be formed on the surface of the resistive element (38); or (iii) a protection tube (40) may be equipped outside the resistive element (38) on which the separation layer(s) (39) has been formed.

The protection tube (40) can be equipped outside the resistive element (38) in two ways. First, the protection tube (40) may enclose in the thickness direction the whole or part of the resistive element (38) in the length direction as in the W-shaped or U-shaped internal heater (8*a*) illustrated in FIG. 1 or FIG. 3. Or, as in the immersion-type internal heater (8*a*) illustrated in FIG. 2, FIG. 4 and FIG. 5, the resistive element (38) may be equipped inside the sealed protection tube (40) in the form of a radiation tube.

In case of a U-shaped or W-shaped heater unit (8*a*), the protection tube (40) may be in various forms including a tube, a conduit, a shaped article, etc., depending on the type of the resistive element (38) and installed as contacting the resistive element (38) or with a space between the protection tube (40) and the resistive element (38).

Further, the resistive element (38) and/or the protection tube (40) may be constructed as a single unit or may comprise a plurality of components.

For example, FIG. 1 schematically illustrates a case where heater unit is constructed by electrically connecting the two vertical components and horizontal bridges equipped at the electrical connection means (9), or the electrode.

The plurality of components constituting the resistive element (38) and/or the protection tube (40) may be coupled through (i) mechanical processing of the connecting means of the resistive element (38), (ii) welding using a welding means or plasma/arc etc., (iii) use of connection fitting or components or (iv) combination of the above.

The components may have the same size and be made of the same material. But, different sizes or materials may also be used as long as such physical properties of the components as cross-section, length, etc. are selected considering the temperature-dependent electric properties and the components are processed for easy engagement.

The immersion-type, i.e., the radiation tube-type heater unit (8*a*), which includes a filament/wire radiator, a quartz tube radiator, a ceramic radiator, etc., is advantageous in selecting the resistive element (38) because the resistive element (38) can be safely protected as sealed off. The protection tube (40) that can be used in the heater unit (8*a*) of the present invention may have a variety of cross-sectional shaped in the thickness direction, including concentric circular, elliptical, polygonal, etc. Since the protection tube (40) contacts the silicon particles (3), it should be made of one layer, i.e., a single component material, or a plurality of layers (39), so that the contamination of the silicon particles (3) by the impurities from the internal heater (8*a*) and/or the tube (40) itself can be prevented. Further, preferably, the layer (39) or the material constituting the protection tube (40) needs to provide the electrical insulation of preventing electric current from the resistive element (38) to the high purity silicon particles (3) which become electrically conductive at high temperature.

In order to heat the silicon particles (3) and the fluidizing gas (10) using the heater unit (8*a*) without a protection tube (40), it is preferable to form one or a plurality of separation layers (39) on the surface of the resistive element (38) in order to prevent impurity contamination. Further, as in the protection tube (40), it is preferable that the separation layer(s) (39) also needs to provide the electrical insulation of preventing electric current from the resistive element (38) to the high purity silicon particles (3). In this case, the separation layer(s) (39) also performs the role of the protection tube (40) which protects the resistive element (38).

In order to ensure the electrical insulation and to prevent impurity contamination of the silicon particles (3), the heater unit (8*a*) may be constructed by installing the protection tube (40) enclosing the resistive element (38) on which the separation layer(s) (39) has been formed. In this case, the protection tube (40) may be equipped at the whole or part of the heater unit (8*a*) along the length direction.

As aforementioned, the heater unit of the internal heater (8*a*) of the present invention may be constructed in a variety of ways, depending on the number of the separation layer(s) (39), presence or absence of the protection tube (40), etc.

Figure 6:
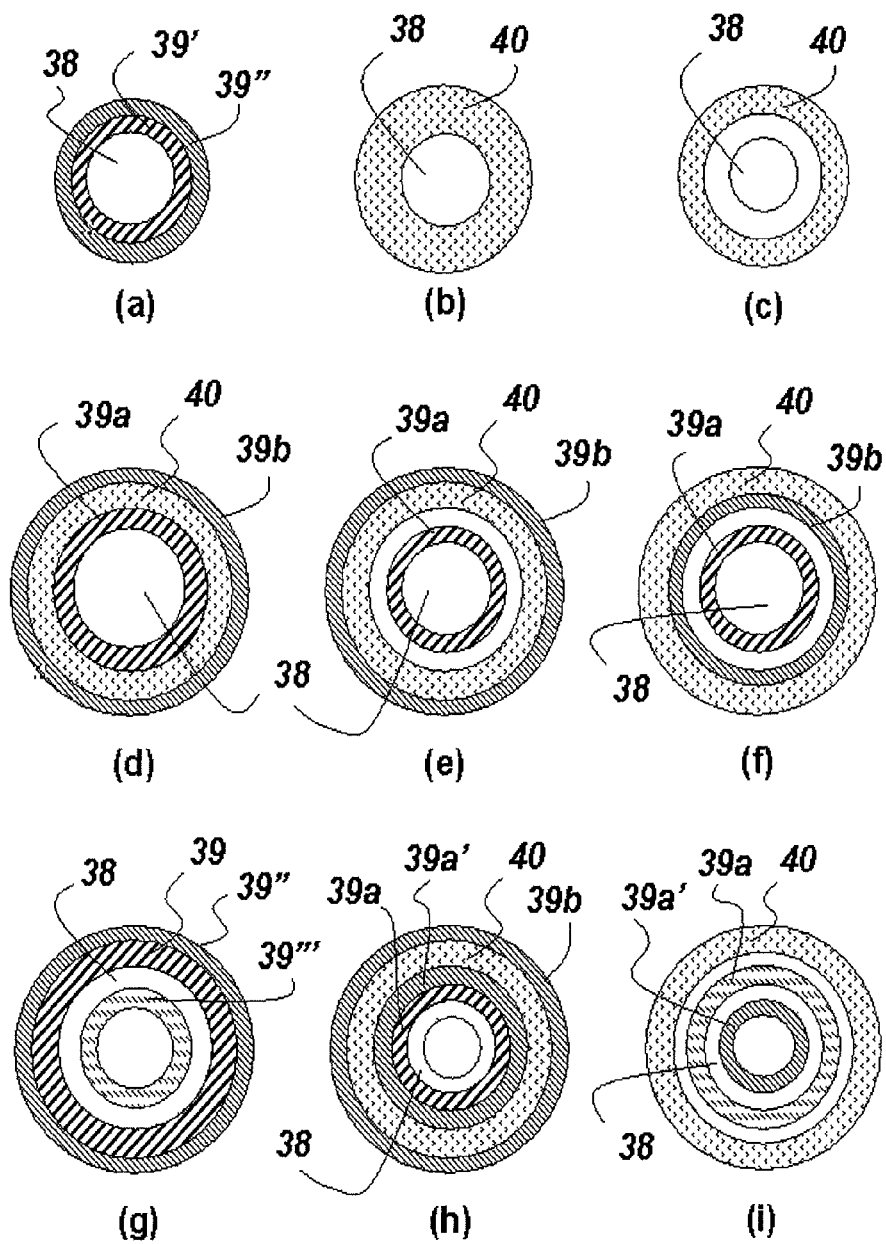
FIG. 6 schematically illustrates the cross-sections of the U-shaped internal heaters according to the present invention in which the cross-sections of the resistive elements are circular or concentric.

Even in the simplest form of example in which the resistive element (38) and/or the protection tube (40) may have a circular or concentric cross-section, the cross-section of the heater unit may be constructed in various forms as illustrated in (a)-(i) of FIG. 6.

FIG. 6(*a*) illustrates a case where two types of separation layers (39' 39") are formed on the surface of a rod-type resistive element (38); FIG. 6(*b*) illustrates a case where a rod-type resistive element (38) is enclosed by and in contact with a protection tube (40); FIG. 6(*c*) illustrates a case where a rod-type resistive element (38) is enclosed by a protection tube (40) with a space; FIG. 6(*d*) illustrates a case where the outer surface of a rod-type resistive element (38) on which a separation layer (39*a*) has been formed contacts the inner surface of a protection tube (40) on which an additional separation layer (39*b*) has been formed; FIG. 6(*e*) illustrates a case where a rod-type resistive element (38) on which a separation layer (39*a*) has been formed is inserted with a space in a protection tube (40) on the outer surface of which an additional separation layer (39*b*) has been formed; FIG. 6(*f*) illustrates a case where a rod-type resistive element (38) on which a separation layer (39*a*) has been formed is inserted with a space in a protection tube (40) on the inner surface of which an additional separation layer (39*b*) has been formed; FIG. 6(*g*) illustrates a case where two separation layers (39, 39") are formed on the outer surface of tube-type resistive element (38) and one separation layer (39") is formed on the inner surface; FIG. 6(*h*) illustrates a case where a tube-type resistive element (38) on the outer surface of which is formed a separation layer (39*a*, 39*a'*) contacts the inside of a protection tube (40) on the outer surface of which is formed an additional separation layer (39*b*); and FIG. 6(*i*) illustrates a case where a tube-type resistive element (38), on the outer surface of which has been formed a separation layer (39*a*) and on the inner surface of which has been formed separation layer (39*a'*), is inserted with a space in a protection tube (40).

Further, a U-shaped or a W-shaped heater unit can be constructed in a variety of ways utilizing the combination of some examples illustrated in FIG. 6 for the purpose of preventing impurity contamination of the silicon particles by the resistive element (38).

Figure 7:
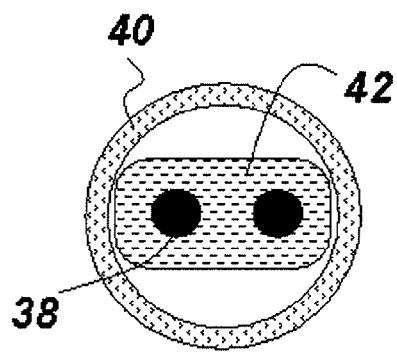
FIG. 7 schematically illustrates the cross-sections of the radiation tube-type internal heater according to the present invention.
Figure 7:
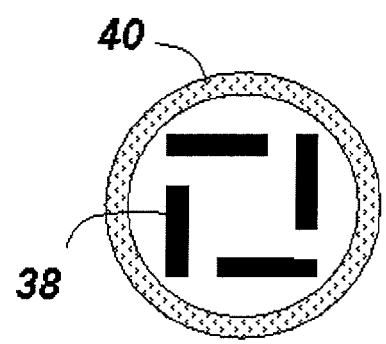
Figure 7:
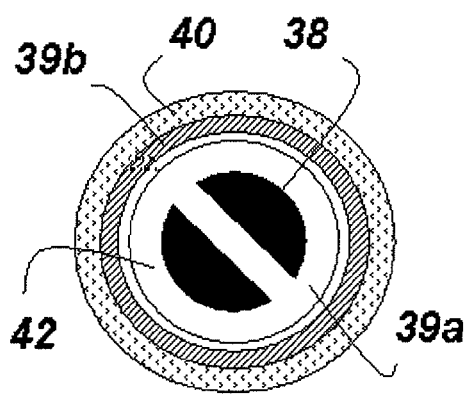
Figure 7:
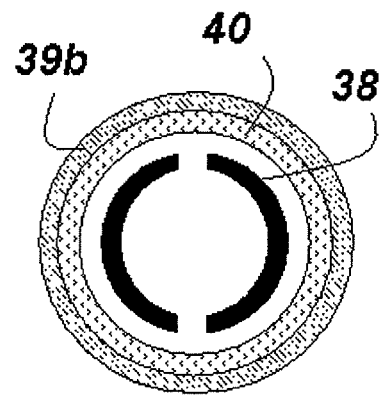

The immersion-type, i.e., the radiation tube-type internal heater (8*a*) may also be constructed in a variety of industrially applicable ways. FIG. 7(*a*)-(*d*) schematically illustrates some examples of the cross-section of the resistive element (38) in its thickness direction.

FIG. 7(*a*) illustrates a case where a wire, rod or filament type resistive element (38) is supported by an insulating material (42) inside a protection tube (40); FIG. 7(*b*) illustrates a case where a resistive element (38) has been processed to have a squared cross-section and are equipped in a protection tube (40); FIG. 7(*c*) illustrates a case where the resistive element (38) with a semicircular cross-section is completely enclosed by a layer (39*a*) inside a protection tube (40) on the inner surface of which an additional separation layer (39*b*) has been formed; and FIG. 7(*d*) illustrates a case where a resistive element (38), which has been processed in the form of a cut tube, is equipped inside a protection tube (40) on the outer surface of which an additional separation layer (39*b*) has been formed.

A separation layer (39) may further be formed on the surface of the resistive element (38) and/or the protection tube (40).

As in the U-shaped or W-shaped heater unit, the resistive element (38) comprised in the radiation tube-type heater unit may also be surface-coated with a separation layer (39) to prevent impurity contamination and/or the corrosion of the resistive element (38).

The radiation tube-type heater needs electricity inlet and outlet terminals for each unit. Also, it is required that the components of the resistive element (38) illustrated in FIGS. 7(a)-(d) are electrically interconnected inside the protection tube (40), so that the current supplied from the input terminal can leave through the output terminal.

As described above, the construction of the resistive element (38) and/or the protection tube (40) can be selected variously without regard to the heater type. But, it is very important to form the separation layer (39) well, if required to prevent impurity contamination as much as possible.

The separation layer (39) and/or the protection tube (40) according to the present invention may comprise one or a plurality of layers. But, if it comprises more than 5 layers, the difference in thermal expansion among the barrier components becomes excessive and much time, labor and cost is required to form the separation layer (39). Thus, the separation layer (39) and/or the protection tube (40) preferably comprise from 1 layer to 5 layers.

It is required that the barrier component of the present invention comprises a component for preventing the diffusion of impurities from the resistive element (38) to the silicon particles (3) and/or the fluidizing gas (10).

If the current supplied to the internal heater (8a) flows toward the high purity silicon particles (3), which have considerable electric conductivity at high temperature, the silicon particles (3) may melt down and stick together instantaneously.

To prevent such problem, the barrier component may be selected among electrically insulating components, so that the separation layer (39) and/or the protection tube (40) comprises at least one electrical insulation layer.

The barrier component constituting the separation layer (39) and/or the protection tube (40) of the present invention may be selected from the components that can form an electrical insulation layer and/or a layer which can prevent the impurities included in the resistive element (38) from being diffused into the silicon particles (3) and/or the fluidizing gas (10).

The examples of the barrier component include nitride, oxide, carbide or oxynitride of an element which has non-metallic properties at room temperature such as silicon (Si) or boron (B).

Further, the barrier component may comprise nitride, oxide, silicide, boride, carbide, oxynitride or silicon oxide of at least an element which has metallic properties at room temperature selected from tungsten (W), rhenium (Re), osmium (Os), tantalum (Ta), molybdenum (Mo), niobium (Nb), iridium (Ir), ruthenium (Ru), technetium (Tc), hafnium (Hf), rhodium (Rh), vanadium (V), chromium (Cr), zirconium (Zr), platinum (Pt), thorium (Th), lanthanum (La), titanium (Ti), lutetium (Lu), yttrium (Y), iron (Fe), nickel (Ni), magnesium (Mg) and aluminum (Al).

The nitride-based barrier component includes a single component nitride such as Si—N, W—N, Os—N, Ta—N, Mo—N, Nb—N, Ir—N, Ru—N, Tc—N, Hf—N, Rh—N, V—N, Cr—N, Zr—N, Pt—N, Th—N, Ti—N, Lu—N, Y—N, etc. and a composite metal nitride such as W—V—N, W—Si—N, Ta—Si—N, Ti—Si—N, Ti—C—N, Hf—Ta—Mo—N, etc.

The nitride-based components mostly have a melting point of 2,000° C. or higher and other physical properties different from the resistive element (38) and can bind with the impurities from the resistive element (38), making them applicable to be used as the separation layer (39). Since the nitrogen component of the nitride-based separation layer (39) hardly contaminates the heating zone ($Z_h$), it can be used in a single or a plurality of separation layers (39). Further, the silicon nitride components having Si—N bond, which offers electrical insulation, can be used to form a heater unit along with an oxide-based, oxynitride-based, carbide-based, silicide-based or silicon oxide-based separation layer (39).

The oxynitride-based barrier component includes a single component oxynitride such as Si—O—N, W—O—N, Os—O—N, Ta—O—N, Mo—O—N, Nb—O—N, Ir—O—N, Ru—O—N, Tc—O—N, Hf—O—N, Rh—O—N, V—O—N, Cr—O—N, Zr—O—N, Pt—O—N, Th—O—N, Ti—O—N, Lu—O—N, Y—O—N, etc. and a composite metal oxynitride such as Si—Al—O—N, Hf—Zr—O—N, Mo—W—O—N, V—Mo—W—O—N, etc.

The oxynitride-based components mostly have a melting point of 2,000° C. or higher and other physical properties different from the resistive element (38) and can bind with the impurities from the resistive element (38), making them applicable to be used as the separation layer (39). Since the nitrogen and oxygen components of the oxynitride-based separation layer (39) hardly contaminate the deposition zone, they can be used in a single or a plurality of separation layers (39). Further, the silicon oxide nitride components having Si—O—N bond, which offers electrical insulation, can be used to form a heater unit along with a nitride-based, oxide-based, carbide-based, silicide-based or silicon oxide-based separation layer (39).

The oxide-based barrier component includes a single component oxide such as Si—O, W—O, Ta—O, Nb—O, Hf—O, Zr—O, Ti—O, etc. and a composite metal oxide such as W—V—O, Ti—Si—O, Sr—Ti—O, Sr—Ti—Nb—O, Sr—La—Al—O, La—Mn—O, Sr—Hf—O, Nb—Ta—O, Ba—Zr—O, Ba—Mo—O, Ba—Ce—O, Ba—Ti—O, Ca—Ti—O, Sr—Zr—O, Sr—Mn—O, Hf—Ta—Mo—O, Y—Zr—O, etc.

The oxide-based components mostly have a melting point of 1,420° C. or higher and other physical properties different from the resistive element (38) and can bind with the impurities from the resistive element (38), making them applicable to be used as the separation layer (39). Since the oxygen component of the oxide-based separation layer (39) hardly contaminates the heating zone ($Z_h$), it can be used in a single or a plurality of separation layers (39) and can be used to form a heater unit along with a nitride-based, oxynitride-based, carbide-based, silicide-based or silicon oxide-based separation layer (39).

The carbide-based barrier component includes a single component carbide such as Si—C, W—C, Os—C, Ta—C, Mo—C, Nb—C, Ir—C, Ru—C, Tc—C, Hf—C, Rh—C, V—C, Cr—C, Zr—C, Pt—C, Th—C, Ti—C, Lu—C, Y—C, etc., a composite metal carbide such as Si—W—C, Ta—Hf—C, Si—Ti—C, etc. and a transition metal carbon nitride such as W—C—N, Ta—C—N, Zr—C—N, Ti—C—N, etc.

The carbide-based components mostly have a melting point of 2,000° C. or higher and other physical properties different from the resistive element (38) and can bind with the impurities from the resistive element (38), making them applicable to be used as the separation layer (39). Since the oxygen component of the carbide-based separation layer (39) tends to contaminate the heating zone ($Z_h$), it is preferable to, rather using it as single separation layer (39), use a nitride-based, oxynitride-based, silicide-based or silicon oxide-based separation layer (39) to shield it from the heating zone ($Z_h$).

The silicide-based barrier component includes a single component silicide such as W—Si, Os—Si, Ta—Si, Mo—Si, Nb—Si, Ir—Si, Ru—Si, Tc—Si, Hf—Si, Rh—Si, V—Si, Cr—Si, Zr—Si, Pt—Si, Th—Si, Ti—Si, Lu—Si, Y—Si, Mg—Si, etc. and a composite metal silicide such as W—V—Si, W—Ti—Si—N, Ti—Zr—Si—C, Hf—Ta—Si—N, etc. A silicon oxide having an oxygen atom bonded to silicide may be included in the silicide-based component.

The silicide-based or silicon oxide-based components may be adjusted to have a melting point of 1,420° C. or higher. Further, since other physical properties are different from that of the resistive element (38) and they can bind with the impurities from the resistive element (38), they may be used as a single or a plurality of separation layer (39). Also, they may be formed into a heater unit along with a nitride-based, oxide-based, oxynitride-based or carbide-based separation layer (39).

Further, the barrier component constituting the separation layer (39) may comprise a boron-containing material with superior physical properties, such as nitride, oxide, carbide, oxynitride, etc., of boron. Since the boron component of the boron-based separation layer (39) may contaminate the heating zone ($Z_h$) at high reaction temperature, it is necessary to, rather using it as single separation layer (39), use a nitride-based, oxynitride-based, silicide-based or silicon oxide-based separation layer (39) to shield it from the heating zone ($Z_h$).

The construction of the heater unit by forming a separation layer (39) on the surface of the resistive element (38) according to the present invention may be performed in a variety of ways.

For example, as described earlier, the heater unit may be constructed by using the construction unit comprising the barrier component of the separation layer (39) to enclose the surface of the resistive element (38) in the faun of a coaxial multitube to form a separation layer (39).

When such a construction unit of the separation layer (39) is used to form the separation layer (39), the heater unit may be constructed by coating or preparing a construction unit of the separation layer (39) for each barrier component depending on the predetermined size, shape and number, and enclosing the resistive element (38) with the separation layer (39).

This method is suitable when a plurality of construction units of the separation layer (39) are assembled to construct the heater unit. The respective construction unit of the separation layer (39) comprises one or a plurality of separation layers (39), each layer which comprises the respective barrier component, in the thickness direction with circular, polygonal, concentrically circular or concentrically polygonal cross-section and is capable of enclosing the surface of the resistive element (38).

According to this method, there may exist tiny spaces between the surface of the resistive element (38) and the separation layer (39), between the separation layer (39) and the separation layer (39) or between the construction unit of the separation layers (39), but they do not interfere with the performance of the heater unit.

Alternatively, the separation layer (39) may be formed by coating each selected barrier component on the surface of the resistive element (38) to a predetermined thickness. With such direct coating of the separation layer (39), a separation layer (39) comprising a plurality of layers may be formed either using a single coating device or using different coating devices.

According to this method, the separation layer (39) may be formed closely without unnecessary spaces between the surface of the resistive element (38) and the separation layer (39) or between the separation layers (39).

Further, the heater unit may be constructed by assembling the construction unit of the separation layer (39) and forming the separation layer (39) by direct coating.

The formation of the separation layer (39) on the entire or part of the surface of the resistive element (38) according to the present invention may be performed using an additional reactor or coating device. Alternatively, it may be performed in the fluidized bed reactor utilized in the present invention or in the inner space of an available bell-jar type conventional deposition reactor.

The resistive element (38) is connected to the corresponding set of electrodes of the reactor, and then electricity is supplied through the electrode for heating the resistive element (38). Further, the heater units may be prepared by providing a source gas for forming the separation layer (39) in the deposition reactor to form the separation layer (39) on the surface of the resistive element (38).

Alternatively, part of the separation layer (39) may be formed on the surface of the resistive element (38) using an additional apparatus and the remaining separation layer (39) may be further formed using the deposition reactor utilized in the present invention or a conventional deposition reactor.

In this case, one or a plurality of incomplete heater units may be located inside the deposition reactor as connected with the electrodes, and then electricity may be provided through the electrodes for heating the incomplete heater unit. Further, a source gas for forming the separation layer (39) inside the deposition reactor may be introduced to form the separation layer (39) and to complete the heater units that can be utilized in the present invention.

Further, in the present invention, the separation layer (39), comprising a single or a plurality of layers, may be formed by: (i) physical vapor deposition (PVD) (including sputtering deposition, pulsed laser deposition, ion implantation, ion plating, etc.); (ii) chemical vapor deposition (CVD) (including atmospheric pressure CVD, metallic organic CVD, plasma-enhanced CVD (PECVD), etc.); (iii) melt spray coating including various spray techniques and aerosol deposition; (iv) thermo-reactive deposition and diffusion (including melt salt technique and powder technique); and (v) various coating techniques including sol-gel method and solution method.

In the present invention, the thickness of the separation layer (39) is preferably in the range of from 1 μm to 5 mm in total and/or the thickness of the protection tube (40) preferably ranges from 1 mm to 20 mm.

If the thickness of the separation layer (39) is smaller than 1 μm in total, the barrier component does not offer a sufficient separation effect. In contrast, if the thickness is larger than 5 mm in total, it is difficult to form the separation layer (39) and layer separation may occur due to the difference in the thermal expansion, making it more convenient to use the protection tube (40).

Further, if the thickness of the protection tube (40) is smaller than 1 mm in total, it may be easily broken by the contact with the silicon particles (3) or external impact. In contrast, if the thickness is larger than 20 mm in total, the space taken by the internal heater units (8a) in the heating zone ($Z_h$) becomes unnecessarily large and it is undesirable in terms of the heating efficiency of the silicon particles (3).

As described above, the selection of the number, physical properties, etc. of the barrier component and the separation layer (39) constituting the separation layer (39) and/or the protection tube (40) may be predetermined by testing the efficiency of preventing the diffusion of impurities, electric insulating performance, physical stability, etc.

As aforementioned, in order to more completely prevent impurity contamination of the silicon particles (3) by the heater units through forming the separation layer (39) on the surface of the resistive element (38), the separation layer (39) may further comprise a silicon layer comprising silicon as a barrier component with a thickness in the range of from 1 μm to 5 mm.

The necessity of adding the silicon layer to the separation layer (39) and the thickness, location, etc. of the silicon layer to be added can be determined by a preliminary experiments.

If necessary, the addition of the silicon layer to the separation layer (39) may be performed inside the deposition reactor according to the present invention or the conventional deposition reactor using a reaction gas (11) for silicon deposition or using an additional coating, film forming or reaction devices.

In this case, the coating of the silicon layer is preferably performed under the reaction condition where it can firmly bond to the corresponding separation layer (39).

As described above, during the preparation of the heater units, before and after the processing of the resistive element (38), before and after the formation of the separation layer (39) or prior to the operation of silicon deposition, it is preferable to thermally treat the heater units in the temperature range of 400-3,000° C. in order to remove or chemically modify the remaining impurities.

Further, the thermal treatment of the heater units is preferably performed in vacuum or under a gas atmosphere of hydrogen, nitrogen, argon, helium, etc.

The thermal treatment may be performed in the deposition reactor utilized in the present invention or in the conventional deposition reactor. Alternatively, it may be performed using an additional thermal treatment apparatus or coating devices.

Although not all the embodiments were illustrated in drawings, a variety of methods and apparatuses of the present invention can be conceived of by selecting and combining the necessary contents and elements illustrated in this description and FIGS. 1 to 4.

INDUSTRIAL APPLICABILITY

As apparent from the above description, the fluidized bed reactor of the present invention and the method for preparing polysilicon using the same provide the following advantages.

(1) Since the space where the bed of silicon particles formed within the reactor tube is divided into the reaction zone and the heating zone by the reaction gas supplying means, the problem of deposition and accumulation of silicon in the heating zone and interruption of the operation of the reactor resulting therefrom can be prevented.

(2) Since the silicon particles can be continuously intermixed between the two zones in the fluidized state while the silicon particles in the heating zone and the fluidizing gas passing through this zone are heated by the internal heater installed in the inner space of the heating zone, the heat required for the silicon deposition can be rapidly supplied to the reaction zone.

(3) As the internal heater is installed inside the heating zone, unnecessary heat loss can be minimized and the reaction temperature required for the silicon deposition with good yield can be maintained easily.

(4) When a packed bed is formed with packing materials around the internal heater installed in the heating zone, the consumption of heat required to heat the fluidizing gas in the heating zone can be minimized while increasing the heating rate, reducing heat loss toward the bottom of the heating zone and not interrupting the fluidization of the silicon particles, which is required for quick heat transfer between the two zones.

(5) Since sufficient heat can be supplied to the reaction zone, which is subject to continuous cooling by the injection of the reaction gas, the reaction pressure can be increased and the productivity of the fluidized bed reactor can be maximized.

(6) Since the present invention can be applied to a fluidized bed reactor of any type or structure, as long as the bed of silicon particles can be divided into the reaction zone and the heating zone with the level of the reaction gas supplying means outlet as reference height, it is widely applicable in the preparation of granular polysilicon.

(7) As the pressure difference between both sides of the reactor tube can be maintained within a narrow range, the mechanical stability of the reactor tube can be ensured despite of the formation of silicon deposit under high pressure, and the damage of the reactor tube caused by the pressure difference between both sides of the reactor tube can be prevented.

(8) The present invention can be applied to the large-scale high purity polysilicon particles since the silicon particles can be efficiently heated while minimizing impurity contamination.

Those skilled in the art will appreciate that the concepts and specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the present invention as set forth in the appended claims.

What is claimed is:

1. An apparatus for preparing granular polysilicon comprises:

a reactor tube, an inner space of which comprises a heating zone and a reaction zone above the heating zone, wherein the inner space comprises an inner zone where the bed of silicon particles is present and silicon deposition occurs;

a reactor shell enclosing the reactor tube, wherein a space in between the reactor tube and the reactor shell comprises an outer zone where the bed of silicon particles is not present and silicon deposition does not occur;

an inert gas connecting means that maintains a substantially inert gas atmosphere in the outer zone;

a pressure controlling means that measures and/or controls an inner zone pressure (Pi) and/or an outer zone pressure (Po), and a pressure-difference controlling means that maintains the difference in the outer zone pressure (Po) and the inner zone pressure (Pi) in the range of about 0.01 bar to about 1 bar;

a fluidizing gas supplying means that supplies a fluidizing gas for fluidizing the bed of silicon particles to a bottom of the heating zone, and comprises a gas distribution means for distributing the fluidizing gas across the cross-section at the bottom of the heating zone, wherein the gas distribution means comprises a gas distribution plate or a gas distribution assembly having a plurality of holes and/or nozzles that are arranged to distribute the fluidizing gas across the cross-section at the bottom of the heating zone;

a reaction gas supplying means installed within the bed of silicon particles and supplying a reaction gas required for silicon deposition into the bed of silicon particles;

an internal heater installed in a space in between the reaction gas supplying means and the inner wall of the reactor tube, wherein the internal heater and the reaction gas supplying means are installed vertically from the gas distribution means through the cross-section at the bottom of the heating zone, the internal heater and the reaction gas supplying means intersecting with the gas distribution means, such that the gas distribution plate or the gas distribution assembly surrounds the intersection of the internal heater with the gas distribution means, and surrounds the intersection of the reaction gas supplying means with the gas distribution means;

a gas discharging means discharging an off-gas out of the reactor shell; and a particle discharging means discharging a part of the silicon particles prepared in the reactor tube, wherein the height of the reaction gas outlet is located higher than the fluidizing gas outlets, is selected as the reference height for dividing the reaction zone and the heating zone, and the height of the internal heater is higher than the fluidizing gas outlets, but not higher than the reaction gas outlet, for heating the fluidizing gas and the silicon particles in the heating zone.

2. The apparatus for preparing granular polysilicon as set forth in claim 1, wherein the form of the gas distribution plate is selected from a grid, a disc or a conical plate.

3. The apparatus for preparing granular polysilicon as set forth in claim 1, wherein a packed bed of packing materials is formed in a space, which is formed in the heating zone and enclosed by the inner wall of the reactor tube, the fluidizing gas supplying means, the reaction gas supplying means and the internal heater, using packing materials that are not fluidized by the flow of the fluidizing gas.

4. The apparatus for preparing granular polysilicon as set forth in claim 3, wherein silicon product particles are discharged through the particle discharging means after residing in or moving through a space formed between the packing materials.

5. The apparatus for preparing granular polysilicon as set forth in claim 3, wherein the packing materials have an average diameter of 5-50 mm and have a shape selected from the group consisting of sphere, bead, ball, granule, fragment, lump, spheroid, polyhedron, pebble, pellet, ring, nugget, and a mixture thereof.

6. The apparatus for preparing granular polysilicon as set forth in claim 3 or claim 5, wherein the packing materials are made of a material selected from the group consisting of quartz, silica, silicon nitride, boron nitride, silicon carbide, graphite, silicon, glassy carbon, and a mixture thereof.

7. The apparatus for preparing granular polysilicon as set forth in claim 6, wherein the packing materials consist of a single component material or of a plurality of layers in the thickness direction, each layer of which is made of a different material.

8. The apparatus for preparing granular polysilicon as set forth in claim 1, wherein an insulating material is equipped at the outer zone.

9. The apparatus for preparing granular polysilicon as set forth in claim 1, further comprises a supplemental heater installed in the outer zone.

10. The apparatus for preparing granular polysilicon as set forth in claim 9, wherein a heat load of the supplemental heater is within the range of 10-100% of a heat load of the internal heater.

11. The apparatus for preparing granular polysilicon as set forth in claim 1, further comprises a waveguide, which transmits the microwave generated by a microwave generator, or a microwave generator, wherein the waveguide or the microwave generator is coupled with the reactor shell to supply the microwave into the inner zone.

12. The apparatus for preparing granular poly silicon as set forth in claim 1, wherein the reactor shell is made of at least one metal selected from carbon steel and stainless steel.

13. The apparatus for preparing granular polysilicon as set forth in claim 1, wherein the reactor tube is made of a single component material or a plurality of materials selected from the group consisting of quartz, silica, silicon nitride, boron nitride, silicon carbide, graphite, glassy carbon, silicon, and a mixture thereof.

14. The apparatus for preparing granular polysilicon as set forth in claim 13, wherein the reactor tube consists of a single layer or a plurality of layers in the thickness direction, each layer of which is made of a different material.

15. The apparatus for preparing granular polysilicon as set forth in claim 1, wherein the internal heater comprises one or a plurality of heater units.

16. The apparatus for preparing granular polysilicon as set forth in claim 15, wherein the plurality of heater units are electrically interconnected in series and/or in parallel.

17. The apparatus for preparing granular polysilicon as set forth in claim 15, wherein the heater unit is electrically connected to a power supply source through an electrical connecting means coupled with the reactor shell.

18. The apparatus for preparing granular polysilicon as set forth in claim 17, wherein the electrical connecting means comprises electrodes installed inside and/or outside of the reactor shell and the heater units are electrically interconnected by the electrode in series and/or in parallel.

19. The apparatus for preparing granular polysilicon as set forth in claim 18, wherein the electrode is made of a metal or an alloy comprising at least one metal element selected from copper (Cu), aluminum (Al) and cadmium (Cd) or is made of graphite, the surface of which is treated as silicon carbide.

20. The apparatus for preparing granular polysilicon as set forth in claim 15, wherein a resistive element which the heater unit comprises and at which electrical resistance heating occurs, is in the form of a rod, a wire, a filament, a bar, a strip or a ribbon having circular, elliptical or polygonal cross-section or of a conduit, a tube, a cylinder or a duct having concentric circular, elliptical or polygonal cross-section, with the shape and/or dimension of the cross-section being uniform or variable along the length direction.

21. The apparatus for preparing granular polysilicon as set forth in claim 20, wherein the resistive element is made of one or two materials selected from graphite, silicon carbide and silicon.

22. The apparatus for preparing granular polysilicon as set forth in claim 20, wherein the resistive element is made of a metal or an alloy selected from the group consisting of tungsten (W), rhenium (Re), osmium (Os), tantalum (Ta), molybdenum (Mo), niobium (Nb), iridium (Ir), ruthenium (Ru), technetium (Tc), hafnium (Hf), rhodium (Rh), vanadium (V), chromium (Cr), zirconium (Zr), platinum (Pt), thorium (Th), lanthanum (La), titanium (Ti), lutetium (Lu), yttrium (Y), iron (Fe), nickel (Ni), magnesium (Mg), aluminum (Al), and a mixture thereof.

23. The apparatus for preparing granular polysilicon as set forth in claim 20, wherein the resistive element is made of a ceramic metal selected from the group consisting of molybdenum silicide (Mo—Si), lanthanum chromite (La—Cr—O), zirconia, and a mixture thereof.

24. The apparatus for preparing granular polysilicon as set forth in claim 20, wherein the heater unit is constructed by installing a protection tube outside the resistive element, forming one or a plurality of separation layers on the surface of the resistive element or installing a protection tube outside the resistive element after forming the separation layer(s) on the resistive element.

25. The apparatus for preparing granular polysilicon as set forth in claim 24, wherein the protection tube has concentric circular, elliptical or polygonal cross-section in the thickness direction.

26. The apparatus for preparing granular polysilicon as set forth in claim 24, wherein at least one of the separation layer and the protection tube comprises 1 to 5 layers, each of which is made of a different barrier component.

27. The apparatus for preparing granular polysilicon as set forth in claim 26, wherein the barrier component comprises a component for preventing impurities from migrating to the silicon particles and/or the fluidizing gas from the resistive element.

28. The apparatus for preparing granular polysilicon as set forth in claim 26, wherein the barrier component comprises an electrically insulating component.

29. The apparatus for preparing granular polysilicon as set forth in claim 26, wherein the barrier component comprises nitride, oxide, carbide or oxynitride of silicon (Si) or boron (B).

30. The apparatus for preparing granular polysilicon as set forth in claim 26, wherein the barrier component comprises nitride, oxide, silicide, boride, carbide, oxynitride or silicon oxide of one or a plurality of metal elements selected from the group consisting of tungsten (W), rhenium (Re), osmium (Os), tantalum (Ta), molybdenum (Mo), niobium (Nb), iridium (Ir), ruthenium (Ru), technetium (Tc), hafnium (Hf), rhodium (Rh), vanadium (V), chromium (Cr), zirconium (Zr), platinum (Pt), thorium (Th), lanthanum (La), titanium (Ti), lutetium (Lu), yttrium (Y), iron (Fe), nickel (Ni), magnesium (Mg), aluminum (Al), and a mixture thereof.

31. The apparatus for preparing granular polysilicon as set forth in claim 26, wherein the thickness of the separation layer is in the range of 1 µm to 5 mm in total and/or the thickness of the protection tube is in the range of 1 mm to 20 mm.

32. The apparatus for preparing granular polysilicon as set forth in claim 26, wherein the separation layer further comprises a silicon layer having a thickness in the range of 1 µm to 5 mm with silicon being the barrier component.

33. The apparatus for preparing granular polysilicon as set forth in claim 1, wherein the reaction gas supplying means exposed to heating zone is constructed in the form of a coaxial multitube in which a reaction gas nozzle for supplying the reaction gas is enclosed by one or a plurality of nozzles.

34. The apparatus for preparing granular polysilicon as set forth in claim 33, wherein an inert gas flows at an annular region of the coaxial multitube.

35. The apparatus for preparing granular polysilicon as set forth in claim 34, wherein hydrogen chloride is added to the inert gas continuously, intermittently or periodically.

36. The apparatus for preparing granular polysilicon as set forth in claim 1, wherein the particle discharging means is constructed in the form of a coaxial multitube along with the reaction gas supplying means or in an independent form separately from the reaction gas supplying means.

37. The apparatus for preparing granular polysilicon as set forth in claim 1, wherein material constituting at least one of the fluidizing gas supplying means, the reaction gas supplying means and the particle discharging means comprises at least one selected from the group consisting of quartz, silica, silicon nitride, boron nitride, silicon carbide, graphite, silicon, glassy carbon, and a mixture thereof.

38. The apparatus for preparing granular polysilicon as set forth in claim 37, wherein at least one of the fluidizing gas supplying means, the reaction gas supplying means and the particle discharging means consists of a single component material, or consists of a plurality of layers in the thickness direction, each layer of which is made of a different material.

* * * * *